United States Patent
Speier et al.

(10) Patent No.: US 7,850,347 B2
(45) Date of Patent: Dec. 14, 2010

(54) LIGHT SOURCE COMPRISING EDGE EMITTING ELEMENTS

(75) Inventors: Ingo Speier, Saanichton (CA); Damien Loveland, Richmond (CA)

(73) Assignee: Koninklijke Philips Electronics N.V., Eindhoven (NL)

( * ) Notice: Subject to any disclaimer, the term of this patent is extended or adjusted under 35 U.S.C. 154(b) by 382 days.

(21) Appl. No.: 11/829,617

(22) Filed: Jul. 27, 2007

(65) Prior Publication Data

US 2008/0025047 A1 Jan. 31, 2008

Related U.S. Application Data

(60) Provisional application No. 60/833,902, filed on Jul. 28, 2006.

(51) Int. Cl.
*B60Q 1/06* (2006.01)
(52) U.S. Cl. .................. 362/373; 362/294; 362/249.02
(58) Field of Classification Search ................. 362/236, 362/373, 249.02, 249.06, 294
See application file for complete search history.

(56) References Cited

U.S. PATENT DOCUMENTS

| | | | |
|---|---|---|---|
| 4,454,602 A | 6/1984 | Smith | |
| 5,325,384 A | 6/1994 | Herb et al. | |
| 5,394,426 A | 2/1995 | Joslin | |
| 5,577,832 A * | 11/1996 | Lodhie | 362/249.03 |
| 5,669,703 A * | 9/1997 | Wheeler et al. | 362/249.04 |
| 5,806,965 A * | 9/1998 | Deese | 362/249.04 |
| 5,835,515 A | 11/1998 | Huang | |
| 6,195,376 B1 | 2/2001 | Wilson et al. | |
| 6,352,873 B1 | 3/2002 | Hoden | |
| 6,768,753 B2 | 7/2004 | Treusch | |
| 6,850,549 B2 | 2/2005 | Takigawa et al. | |
| 7,048,412 B2 | 5/2006 | Martin et al. | |
| 2004/0165628 A1 | 8/2004 | Rice | |
| 2004/0212321 A1* | 10/2004 | Lys et al. | 315/291 |
| 2007/0195527 A1* | 8/2007 | Russell | 362/240 |

* cited by examiner

*Primary Examiner*—Jong-Suk (James) Lee
*Assistant Examiner*—Julie A Shallenberger

(57) ABSTRACT

The present invention provides a light source generally comprising one or more edge emitting elements, each having a substantially same or similar emission spectrum, or respective emission spectra/colours, and a number of heat extractors thermally coupled thereto. Driving means are also provided to drive the edge emitting elements. Output optical means, such as reflectors, lenses, diffusers, collimators, filters and the like may also be included to collect, mix and/or redirect light emitted by the edge emitting elements to produce a desired optical effect. The light source may also comprise an optional control feedback system adapted to monitor an output of the light source and adjust the driving means and/or output optical means to maintain a desired or optimal output.

21 Claims, 20 Drawing Sheets

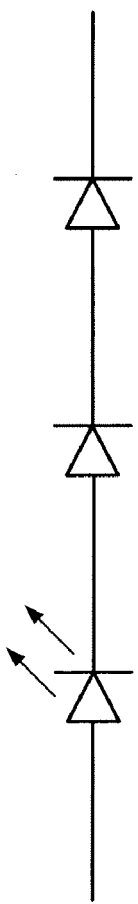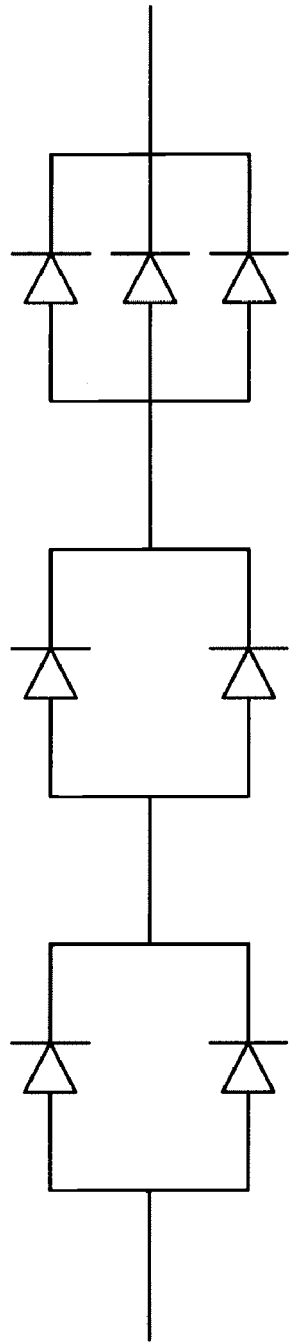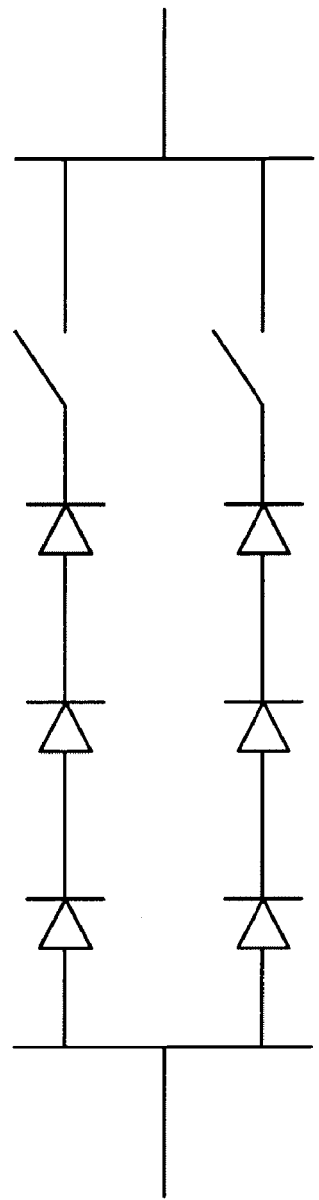

LIGHT SOURCE COMPRISING EDGE EMITTING ELEMENTS

FIELD OF THE INVENTION

The present invention pertains to the field of lighting and in particular to a light source comprising edge emitting elements.

BACKGROUND

Advances in the development and improvements of the luminous flux of light-emitting devices such as solid-state semiconductor and organic light-emitting diodes (LEDs) have made these devices suitable for use in general illumination applications, including architectural, entertainment, and roadway lighting. Light-emitting diodes are becoming increasingly competitive with light sources such as incandescent, fluorescent, and high-intensity discharge lamps.

One challenge frequently encountered when developing LED-based light sources resides in the development of adequate cooling means for the LEDs comprised therein. For instance, since the performance of LEDs is generally sensitive to temperature, and variations therein, temperature dissipation and control often becomes an important design parameter. In particular, light sources combining a plurality of LEDs in a relatively tight configuration, for instance to provide higher output intensities or combined emission spectra, may require careful light source configuration design to enhance temperature management.

In the manufacture of laser diode arrays, and particularly stacked diode bar arrays, modular configurations have been proposed that combine a series of diode bars intercalated between a corresponding series of thermally conductive spacers that provide respective heat sinks and electrical connection for the diode bars. This configuration facilitates testing of the individual modules and the replacement thereof when defective, and generally provides additional structural support for the diode bars leading to improved emission properties. The modules are combined and driven in series to provide a substantially narrowband high output light source for use, for example, as an optical pump for solid state lasers. Examples of such laser diode arrays are proposed in various forms and configurations in U.S. Pat. No. 4,454,602 issued Jun. 12, 1984 to Smith, U.S. Pat. No. 5,325,384 issued Jun. 28, 1994 to Herb et al., U.S. Pat. No. 5,394,426 issued Feb. 28, 1995 to Joslin, U.S. Pat. No. 5,835,515 issued Nov. 10, 1998 to Huang, U.S. Pat. No. 6,195,376 issued Feb. 27, 2001 to Wilson et al., U.S. Pat. No. 6,352,873 issued Mar. 5, 2002 to Hoden et al., and U.S. Pat. No. 6,768,753 issued Jul. 27, 2004 to Treusch.

LED-based light sources currently used, for example, in general purpose illumination applications, generally combine one or more surface emitting LEDs to provide a desired luminous effect. For instance, these surface emitting LEDs may be mounted in groups or arrays to provide illumination at one or more wavelengths that may, if appropriately configured, be combined to provide a desired output spectrum or pattern. LED-based light sources providing such combined outputs may be used, for example, as a white light source (e.g., combining red, green and blue (RGB) LEDs, red, amber, green and blue (RAGB) LEDs, etc.), as a patterned or multicolour light source, or as a light source of a desired or variable output spectrum.

Various examples of such general purpose LED-based light sources are provided in U.S. Pat. No. 7,048,412 for an Axial LED Source, issued May 23, 2006 to Martin et al., wherein the proposed light sources comprise a number of LEDs disposed along facets of a light source axis and radiating outwardly therefrom toward a collector disposed to collect and redirect the emitted light to produce a desired luminous effect. Other such general purpose LED-based light sources, generally comprising LED arrays disposed perpendicularly to the light source axis, are also illustrated therein.

In these and other available general purpose LED-based light sources, the surface emitting LEDs used are generally configured to provide a first large light-emitting surface and an opposite surface from which heat generated by the LED is dissipated through a heat sink or the like. For high output light sources, however, the above surface emitting configuration often leads to various heat management and/or cooling difficulties that affect the overall performance of the light source.

Consequently, there is a need for improved light sources, comprising LEDs and/or other such light-emitting elements, that overcome at least some of the drawbacks of known light sources.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a light source comprising edge emitting elements. In accordance with one aspect of the present invention, there is provided a light source for providing illumination, comprising: one or more edge emitting elements each respectively comprising one or more light-emitting edges adjoining two substantially opposed surfaces, an area of said substantially opposed surfaces being greater than that of said one or more light-emitting edges; one or more heat extractors, one or more of said substantially opposed surfaces of each of said one or more edge emitting elements being thermally coupled to a respective one of said heat extractors configured to extract heat therefrom; and driving means for driving said one or more edge emitting elements to emit light via said one or more light-emitting edges thereof to provide the illumination.

In accordance with another aspect of the present invention, there is provided a light-emitting structure for use in an illumination light source comprising driving means for driving the light-emitting structure, the light-emitting structure comprising: two or more light-emitting layers respectively intercalated between successive heat extractor layers, each of said light-emitting layers comprising one or more edge emitting elements, each one of which comprising a light-emitting edge adjoining two substantially opposed surfaces configured to thermally couple said edge emitting elements to said successive heat extractor layers, an area of said substantially opposed surfaces being greater than that of said one or more light-emitting edges.

BRIEF DESCRIPTION OF THE FIGURES

FIGS. 16A to 16D are schematic circuit diagrams for connecting light emitting elements according to embodiments of the present invention;

DETAILED DESCRIPTION OF THE INVENTION

Definitions

Figure 1:
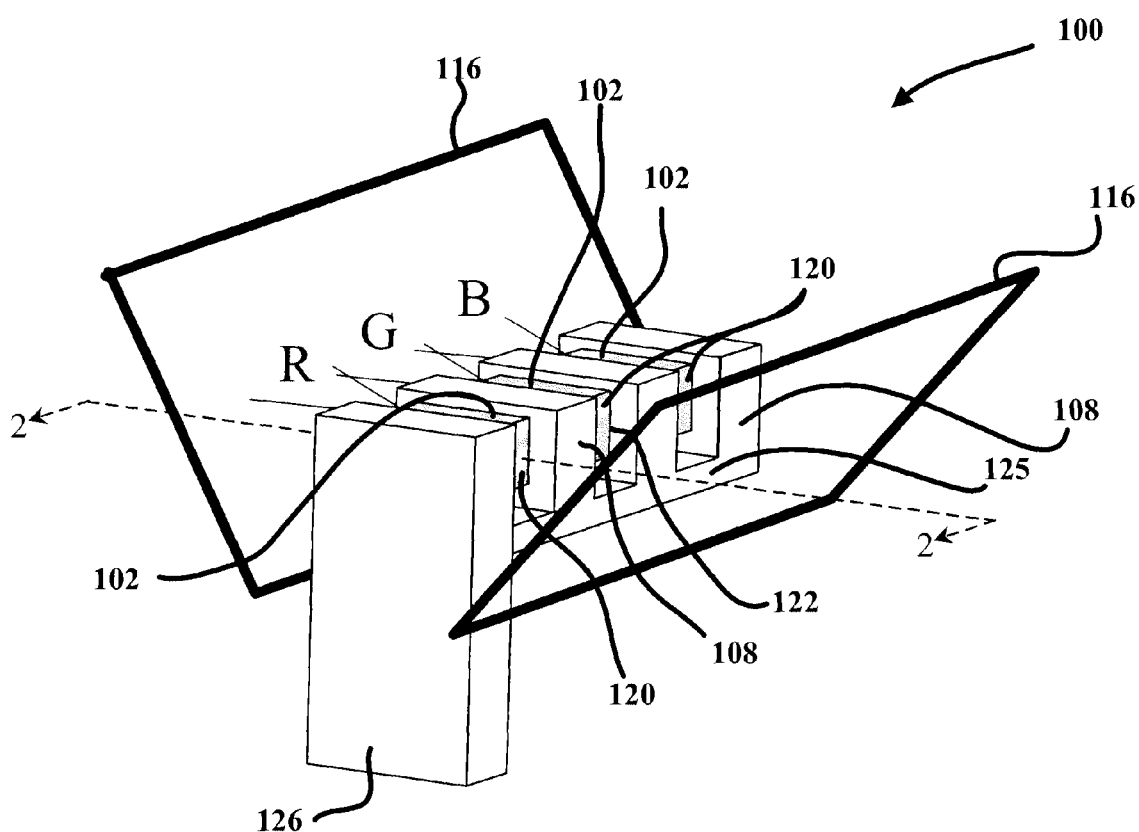
FIG. 1 is a perspective view of a light source comprising edge emitting elements in accordance with one embodiment of the present invention.

The term "light-emitting element" is used to define a device that emits radiation in a region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic, polychromatic or broadband spectral emission characteristics. Examples of light-emitting elements include semiconductor, organic, or polymer/polymeric light-emitting diodes, superluminescent diodes, lasing diodes, optically pumped phosphor coated light-emitting diodes, optically pumped nano-crystal light-emitting diodes or other similar devices as would be readily understood by a worker skilled in the art. Furthermore, the term light-emitting element is used to define the specific device that emits the radiation, for example a LED die, and can equally be used to define a combination of the specific device that emits the radiation together with a housing or package within which the specific device or devices are placed.

The term "edge emitting element" is generally used to define a light-emitting element, as defined above, which emits light from one or more of its edges, that is, from an edge generally adjoining two substantially opposed surfaces each having an area at least greater than that of this edge. In other words, the term "edge emitting element" is used to represent a light-emitting element from which light is emitted via one or more light-emitting edges thereof, the one or more light-emitting edges having an area that is at least lesser than that of at least some of the nominally non-emitting surfaces of the light-emitting element. As will be discussed further below, at least some of these larger non-emitting surfaces are used for heat dissipation. The term "edge emitting element" also refers to an element emitting light from the edge of an active layer within the element, irrespectively of how the element is cut from its multilayered wafer during manufacture. It is contemplated that light can be emitted from a surface of an edge emitting element, as defined herein, which is not one of the smallest surfaces of this element, but which remains of lesser area than at least one of the nominally non-emitting surfaces of the light-emitting element. The term edge emitting element may also refer to a light emitting element from which light is totally internally reflected, or at least substantially reflected, from one or more smaller area surfaces, which would otherwise be light emitting edges, to be emitted from a portion or portions of one or more larger surfaces, which would be nominally non-emitting surfaces in the absence of the total internal reflection.

The term "non-emitting surface" refers to a surface on a light emitting element, as defined above, through which light would nominally not be emitted, but through which some light may still be emitted in practice. The person of skill in the art will readily understand that such non-emitting surfaces are not meant to exclusively define surfaces from which light may not be emitted, but more generally, to define surfaces of the light-emitting element that are not generally considered as primary light-emitting surfaces, that is, surfaces from which light may be emitted, but in a proportion that is at most secondary relative to emissions provided from the one or more light-emitting edges of such light-emitting elements.

The term "heat extractor" is used to define a material, device, system and/or environment capable of absorbing heat from another object, namely a light-emitting element such as an edge emitting element as defined above, with which it is thermally coupled. A heat extractor, which may comprise one or more independent and/or coupled heat extractors, is generally configured to conduct heat absorbed thereby away from its source (e.g., the light-emitting element) and spread or dissipate the heat over a larger surface area. In general, the heat extractor reduces the temperature of the source through increased thermal mass and/or heat dissipation by conduction, convection, radiation and/or active cooling. Examples of heat extractors may include, but are not limited to, different types of heat sink, for instance comprised of metal structures such as plates, rods and the like (e.g., copper, aluminium, aluminium nitride, copper-tungsten, etc.), different types of thermal electric coolers, forced air systems or heat pipe(s), different types of macro channel or micro channel fluid cooling systems, or other similar heat extraction and/or dissipation system as would be readily understood by a worker skilled in the art. The term heat extractor is further used to define a passive and/or active cooling system(s) operatively and/or thermally coupled to, or integrated within a heat extracting structure of a lighting device.

The terms "spectrum", "spectra" and "emission spectrum" are used interchangeably to define one or more spectral characteristics of a given light source, light-emitting element or other such light-emitting device, wherein such characteristics may include, but are not limited to, a spectral power distribution (SPD), one or more peak intensity wavelengths and/or emission bands, one or more spectral intensity profiles, and the like.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by one of ordinary skill in the art to which this invention belongs.

The present invention provides a light source comprising edge emitting elements. In particular, the light source generally comprises one or more edge emitting elements, each having a substantially same (for example blue, red, green, etc.) or similar (for example warm white and cool white) emission spectrum, or having substantially different respective emission spectra/colours (for example red, green and blue), and one or more heat extractors thermally coupled thereto. Driving means are also provided to drive the edge emitting elements. Output optical means, such as reflectors, lenses, diffusers, collimators, filters and the like may also be included to collect, mix and/or redirect light emitted by the one or more edge emitting elements to produce a desired optical effect. The light source may also comprise an optional control feedback system adapted to monitor output of the light source and adjust the driving means and/or output optical means to maintain a desired or optimal output.

As defined above, each edge emitting element of a given light source generally comprises one or more light-emitting edges and two or more non-emitting surfaces from which heat may be extracted and dissipated via heat extractors respectively coupled thereto. In general, the non-emitting surfaces have an area greater than that of the light-emitting edge(s) and thus provide for greater heat extraction and dissipation. As such, contrary to the use of surface emitting elements in currently available light sources, the use of edge emitting elements, as described herein, provides for greater heat extraction and dissipation, and consequently greater thermal management and temperature control, which may translate into greater light source performance, reliability, stability and longevity.

In general, the one or more edge emitting elements may be operated independently, in a group or array, or as part of one or more stacked edge emitting devices. In one embodiment, for example, each edge emitting element is operated independently via respective driving means. In this embodiment, each edge emitting element is thermally coupled to one or more respective heat extractors (e.g., see FIGS. 4 and 15). The heat extractors of each edge emitting element may be used as independent heat extraction and dissipation means, or may be mutually coupled to provide a combined heat extraction and dissipation system for the entire light source, or for various subgroups of edge emitting elements thereof, as described below.

In another embodiment, a number of edge emitting elements are combined into a stacked light-emitting structure comprising successive intercalated light-emitting layers and heat extractor layers respectively (e.g., see FIGS. 1 to 3, 6 to 8, 10, 11 and 14). Namely, such stacked light-emitting structures may comprise one or more light-emitting layers thermally coupled between two successive heat extractor layers. For instance, in one embodiment, each light-emitting layer comprises a single edge emitting element thermally coupled between two successive heat extractor layers (e.g., see FIGS. 1 and 6). In another embodiment, each light-emitting layer comprises two or more edge emitting elements thermally coupled between two successive heat extractor layers (e.g., see FIGS. 7, 8, 10 and 11). Other stack configurations and permutations having different numbers of light-emitting layers and heat extractor layers, and having various combinations of edge emitting elements and heat extractors for each such layer respectively, should be apparent to the person of skill in the art.

Furthermore, in the above stacked light-emitting structure(s), each edge emitting element of a given light-emitting layer may have a substantially same or similar emission spectrum, different emission spectra, or the structure may comprise a combination of edge emitting elements, some of which having substantially same or similar spectra and some different. For instance, in one embodiment, a stacked light-emitting structure comprises a number of light-emitting layers, each one of which being respectively comprised of edge emitting elements sharing a substantially same or similar emission spectrum/colour. For example, a given stacked light-emitting structure may comprise, in accordance with one embodiment, a first light-emitting layer comprising edge emitting elements each having a first emission spectrum, and a second light-emitting layer comprising edge emitting elements each having a second, different emission spectrum; three or more such layers may also be provided depending on the application for which the light source is to be used.

In addition, a given light source may comprise a single stacked light-emitting structure (e.g., see FIGS. 1 to 3 and 11), or comprise two or more stacked light-emitting structures. For example, in one embodiment, the light source comprises two or more stacked light-emitting structures each emitting light in accordance with a respective emission spectrum or colour. In another embodiment, each stacked light-emitting structure of the light source emits light in accordance with a combined output spectrum obtained by combining the emissions of the various light-emitting layers thereof comprised of edge emitting elements, or subgroups thereof, having different emission spectra.

The person of skill in the art will readily understand that other stacked light emitting structures comprising different combinations of edge emitting elements in different configurations of light-emitting layers and heat extractor layers, may be considered without departing from the general scope and nature of the present disclosure. For instance, adjacent light-emitting layers may share a common heat extractor disposed therebetween, or be coupled to adjacently disposed but distinct heat extractors. Furthermore, stacked light-emitting structures may be manufactured to have various shapes and/or configurations depending on the application for which the light source is to be used. For instance, linear, square or rectangular stacks may be preferable in certain applications (e.g. see FIGS. 1 and 10), whereas cylindrical, conical or annular stacks (e.g. see FIGS. 11 to 13) may be best in other applications. An annular stack, for example, may be disposed around and thermally connected to an axial heat pipe or other thermally conducting or thermally transporting component for extraction of the heat produced by the light emitting elements.

In other embodiments, the stack may be 1D, or linear, and arranged in a horizontal, vertical or other orientation. It may be 2D, in which case edge emitting surfaces form a flat, two dimensional array. It may be a 2D array arranged in a virtual curved surface, such as the surface of a cylinder. It may also be a 3D array, having displaced rows allowing for the radiation emitted by edge emitting elements positioned in one or more rearward rows to pass by the edge emitting elements positioned in one or more frontward rows. The person of skill in the art will understand that these and other such variations are not meant to depart from the general scope and nature of the present disclosure.

Furthermore, as presented above, stacked light-emitting structures may comprise edge emitting elements having different output spectra, or comprise a series of edge emitting elements all emitting light in accordance with a substantially same or similar output spectrum. In the latter embodiment, a stacked light-emitting structure of edge emitting elements of a given output may be combined with light-emitting structures of edge emitting elements having different outputs to produce a combined optical effect. For instance, such combinations may be used in a high output light source to provide, once outputs from respective light-emitting structures are combined via common light collectors, mixers, etc., a combined output having a desired spectrum (e.g., a selected colour output, a white light source, etc.).

Edge Emitting Elements

In one embodiment, an edge emitting element comprises a substantially planar light-emitting element having one or more light-emitting edges adjoining two substantially opposed non-emitting surfaces; the one or more light-emitting edges may form an angle with, or be substantially perpendicular to, the non-emitting surfaces. Furthermore, one or more surfaces of the edge emitting element, generally other than the light-emitting edge thereof, may be coated with a reflective coating, or manufactured to provide an increased internal reflectivity. Such reflective surfaces may be used, for example, to direct emissions of the edge emitting element out of a single edge, or again out of diametrically opposed edges. Also, one or more surfaces, and particularly one or more light-emitting edges of the edge emitting element, may be coated with an anti-reflection coating, or manufactured to provide a decreased internal reflectivity. Such anti-reflective surfaces may be used, for example, to enhance an emission efficiency of the edge emitting element in question.

In another embodiment, an edge emitting element is at least partly manufactured of light guiding materials such that light generated by the edge emitting element is guided by these light guiding materials to the one or more light-emitting edges from which it is emitted. Light guiding materials of lower refractive index may, for example, be disposed along one or more of the non-emitting surfaces of the edge emitting element to form a waveguide. For example, a structure, such as a ridge waveguide or the like may be grown on the edge emitting element. Waveguiding may for example occur due to refractive index variation between active layer, guiding layer and cladding layer on a semiconductor light emitting element such as a semiconductor diode laser. Another example would be application of internal mirror layers that enclose the active layer similar as in the application of a single mirror layer on the substrate side of surface emitting LEDs. In addition a combination of internal waveguiding layers and external waveguiding layers such as mirror coatings and the like may be used to achieve a desired effect. Other examples of similar edge emitting elements will be readily understood by a worker skilled in the art.

In another embodiment of the present invention, reflecting and/or partially reflecting materials may be coated on the one or more light-emitting edges in order to facilitate lasing between these edge surfaces. The surfaces may be polished, and may be flat or curved.

In another embodiment of the present invention, an edge emitting element may be configured such that an otherwise emitting edge thereof is configured to provide total or substantial internal reflection, thereby redirecting light directed thereto toward a portion of a nominally non-emitting surface. In this embodiment, the edge emitting element maintains the benefit of providing one or more generally larger surfaces from which heat may be extracted and/or dissipated, while providing an alternative for output directionality. In this configuration, light generated by the edge emitting element is emitted via an emitting edge thereof, which is, in this embodiment, configured to redirect the light toward a nominally non-emitting surface to be emitted therefrom.

In addition, an edge emitting element can be the specific device that emits the radiation, for example a LED die, and can equally be used to define a combination of the specific device that emits the radiation together with a housing or package within which the specific device or devices are placed (e.g., including heat extractors such as heatsinks, driving electrodes, waveguiding structures, reflective coatings and/or structures, etc.). In one embodiment, an edge emitting element may comprise one edge emitting element or a combination of such edge emitting elements integrally or operatively coupled in a given configuration or array, for example, an edge emitting layer of a layered light-emitting structure or device comprised of two or more edge emitting elements.

Heat Extractor

It will be understood by a person of skill in the art that various types of heat extractors, whether disposed in layers between respective layers of one or more edge emitting elements, or disposed as individual heat extractors for single edge emitting elements, may be considered herein without departing from the general scope and nature of the present disclosure. Furthermore, various heat extractor shapes and configurations may be considered depending on the shape of the light source, and the selected combination and structural configuration of the edge emitting element thereof.

In one embodiment, each heat extractor comprises a heat sink, namely a metal plate or structure (e.g., copper, aluminium, aluminium nitride, copper-tungsten, etc.), thermally coupled to one or more of the non-emitting surfaces (or portion thereof) of one or more edge emitting elements. Each heat sink may further be thermally coupled to a heat sinking base, the latter optionally thermally coupling each heat extractor of a given edge emitting element, a given light-emitting layer, a given array or group of edge emitting elements or a given stacked light-emitting structure. The heat sinking base, or again a given heat sink of a particular edge emitting element, or group, array or stacked structure thereof, may further act as a support for the edge emitting elements in the light source (e.g., see FIG. 1). As will be readily understood by the person of skill in the art, the heat sinking base may also lead to a further heat management system, such as an active cooling system, to further control and maintain operation of the edge emitting elements at a desired and/or optimal operating temperature.

Alternatively, each heat extractor may be operated independently, or in subgroups, depending on the specific design and operational requirements of the given light source. The person of skill in the art will readily understand that a number of heat extraction and dissipation means may be used as heat extractors in the present context without departing from the general scope and nature of the present disclosure. Namely, various types and/or combinations of heat extractors may be considered to provide heat transfer from the non-emitting surfaces of the edge emitting elements to the ambient or to an associated passive and/or active cooling system. As stated above, such heat extractors may include, but are not limited to, various types of heat sink, thermal electric cooler, forced air system, heat pipe(s), fluid cooled systems such as macro channel or micro channel coolers and other similar heat extraction and/or dissipation systems such as a passive and/or active cooling system(s) operatively and/or thermally coupled to, or integrated within, a heat extracting structure of the edge emitting elements.

Figure 15A:
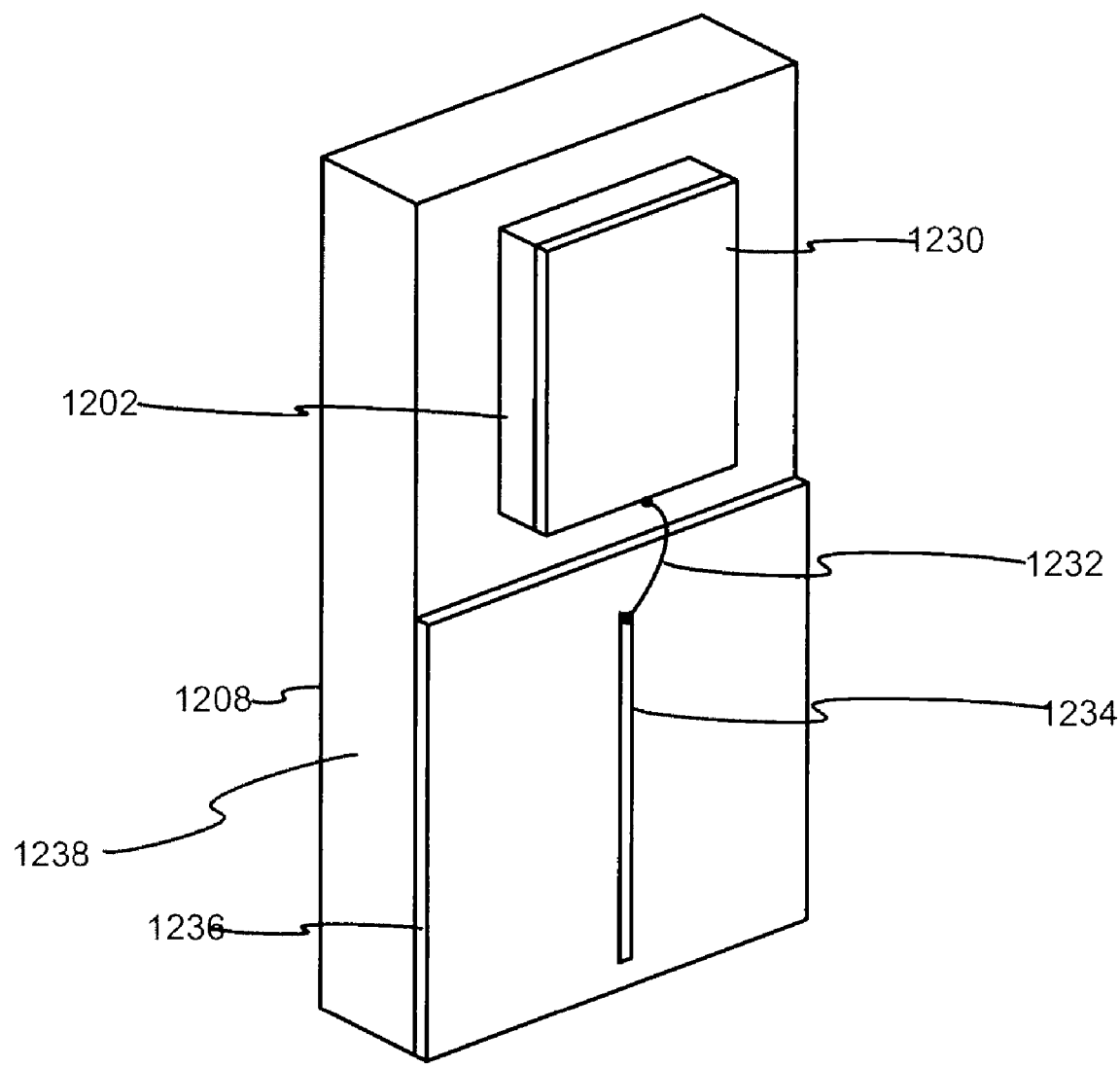
FIG. 15A is a perspective view of a heat extractor carrying a light emitting element in accordance with one embodiment of the present invention.
Figure 15B:
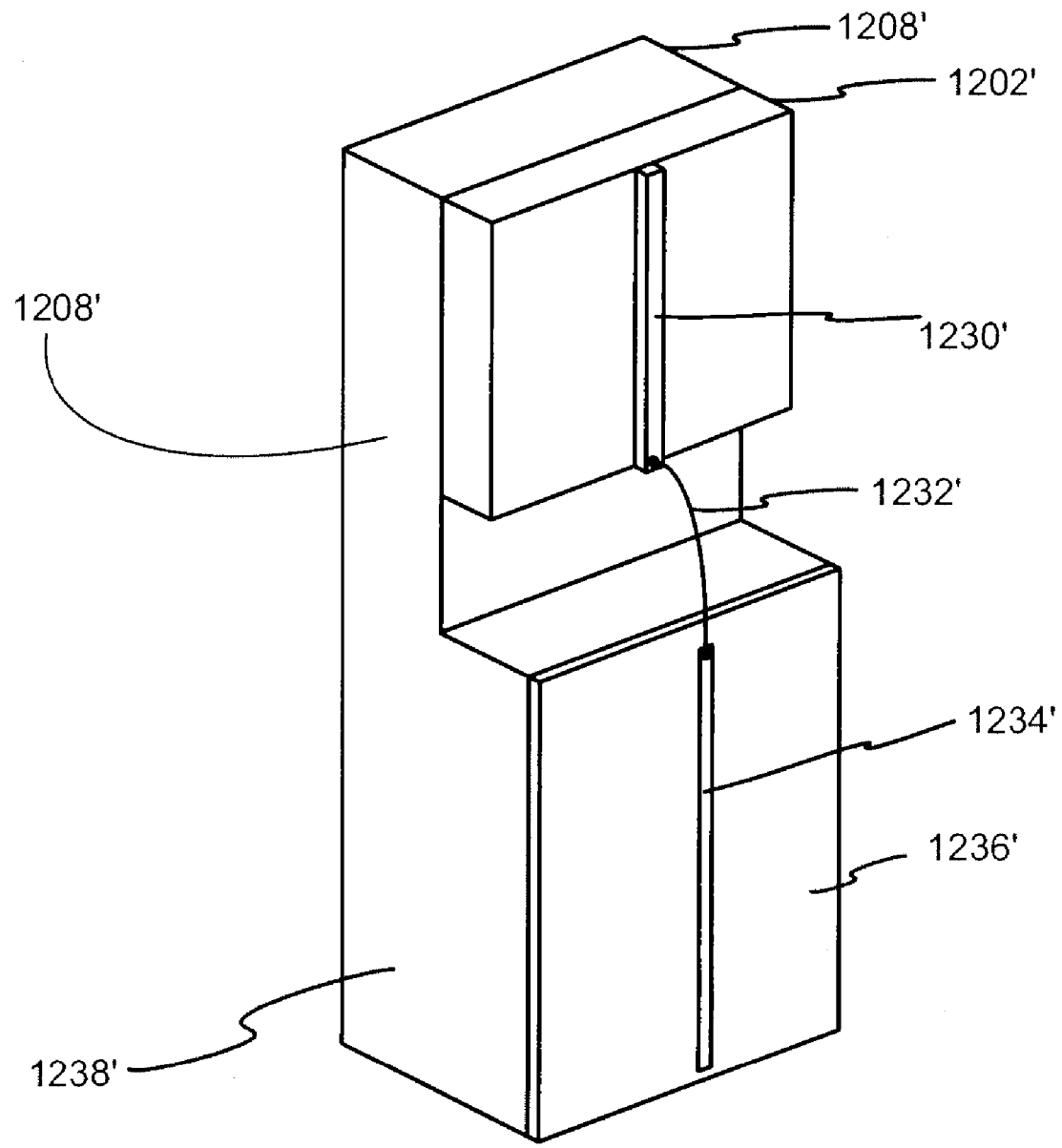
FIG. 15B is a perspective view of a heat extractor carrying a light emitting element in accordance with another embodiment of the present invention.
Figure 16D:
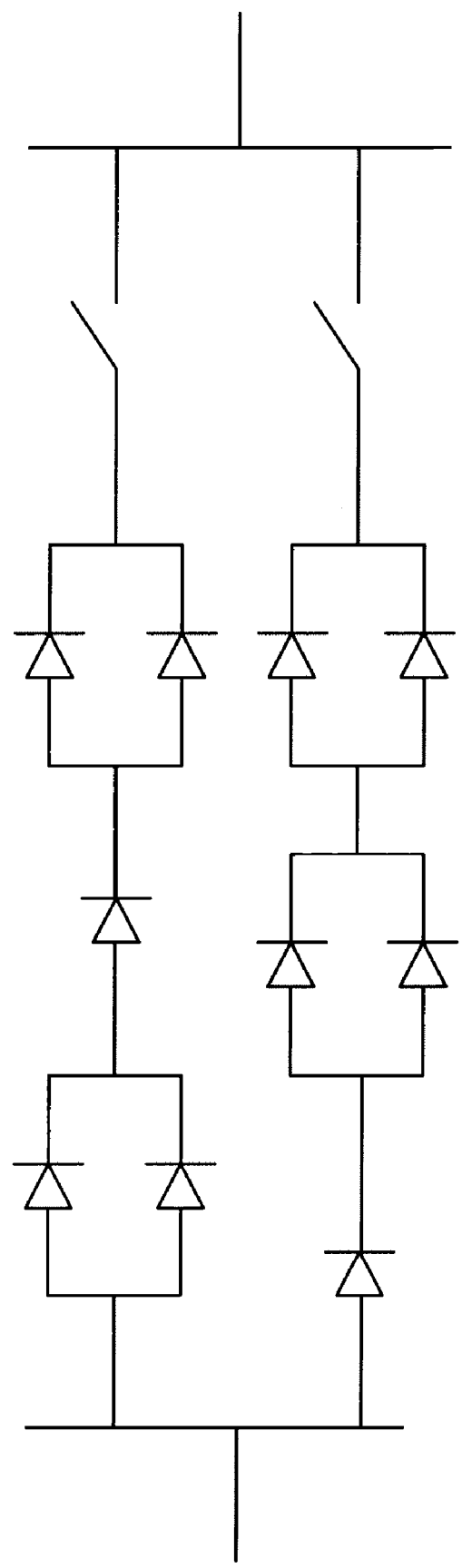

In one embodiment, a heat extractor may support one or more conductive traces which are electrically isolated from the main material of the heat extractor. Electrical energy may thus be supplied to the edge emitting element via the conductive trace and the heat extractor. Examples of conductive traces can be seen in FIGS. 15A and 15B, for example. In the example of FIG. 15A, a substantially flat heat extractor 1208 carries an edge emitting element 1202 having an upper metallic surface contact 1230. The upper metallic surface contact 1230 is wire bonded 1232 to a conductive trace 1234 on a thermally conductive but electrically insulating layer 1236 disposed at a heat dissipation end 1238 of the heat extractor 1208. In the example of FIG. 15B, a stepped heat extractor 1208' carries an edge emitting element 1202' having an upper metallic ridge contact 1230'. The upper metallic ridge contact 1230' is wire bonded 1232' to a conductive trace 1234' on a thermally conductive but electrically insulating layer 1236' disposed at a heat dissipation end 1238' of the heat extractor 1208'. In another example, the heat extractor could be an electrically insulating material, such as a ceramic, with good thermal conductivity. In this case two traces could be used for each edge emitting element.

Optional Output Optics

In the above embodiments, the outputs of each edge emitting element of a given light source, whether independent, combined in subgroups or arrays, or comprised in one or more stacked light-emitting structures, may be combined, using appropriate output optics, to provide a desired optical effect. For example, the outputs of the various edge emitting elements may be combined in a number of ways to provide a patterned output, a collimated output, an output of a selected colour or chromaticity (e.g., via a red, green and blue (RGB) mixing, a red, amber, green and blue (RAGB) mixing, etc.), a variable intensity or chromaticity output (e.g., via variable driving means and/or output optics), or the like.

In one embodiment, the light source comprises edge emitting elements that provide two or more output spectra/colours. For example, a light source having a red edge emitting element, a green edge emitting element and a blue edge emitting element may be considered (e.g., see FIGS. 1, 5 and 11). In such a light source, the respective coloured outputs of the different edge emitting elements can be collected and mixed via a suitable optical means (e.g., reflector(s), lens(es), collimator(s), diffuser(s), optical filter(s), etc.) to provide a combined output spectrum, namely a desired chromaticity. In one embodiment, the desired output is white light generated from the combination of red, green and blue outputs.

Figure 7:
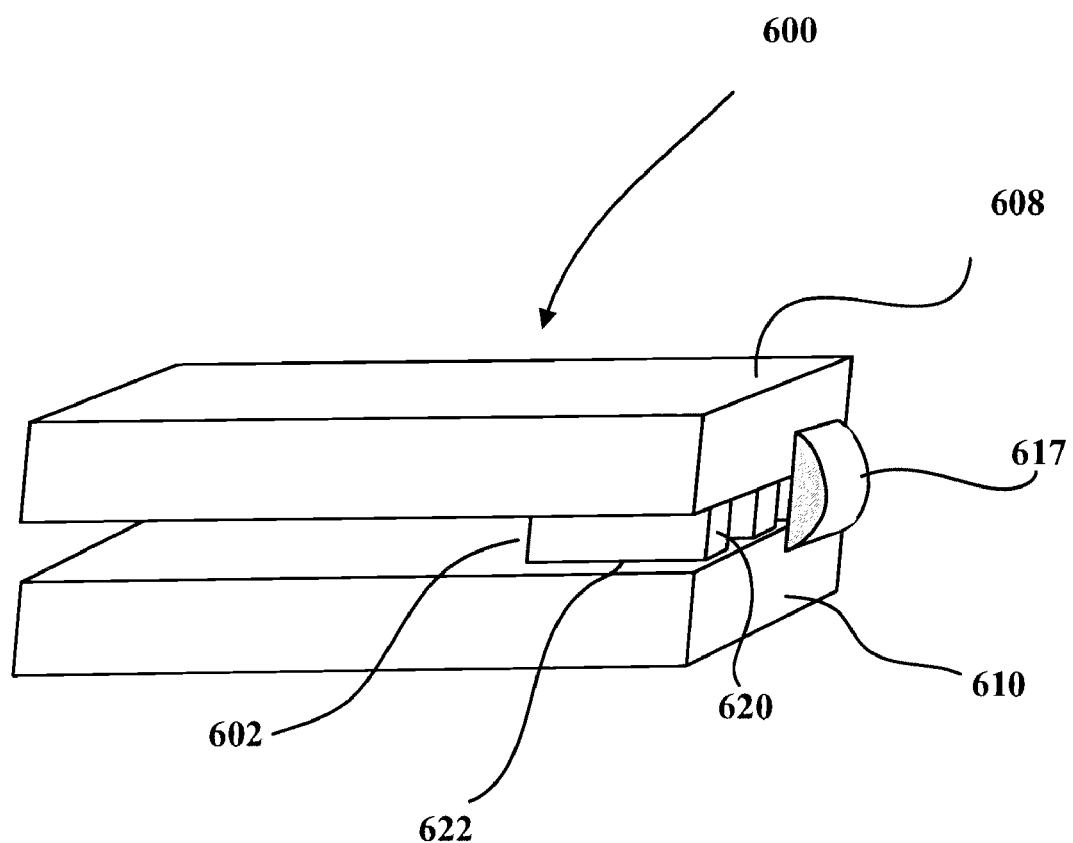
FIG. 7 is a perspective view of a stacked light-emitting structure comprising edge emitting elements in accordance with a further embodiment of the present invention.
Figure 8:
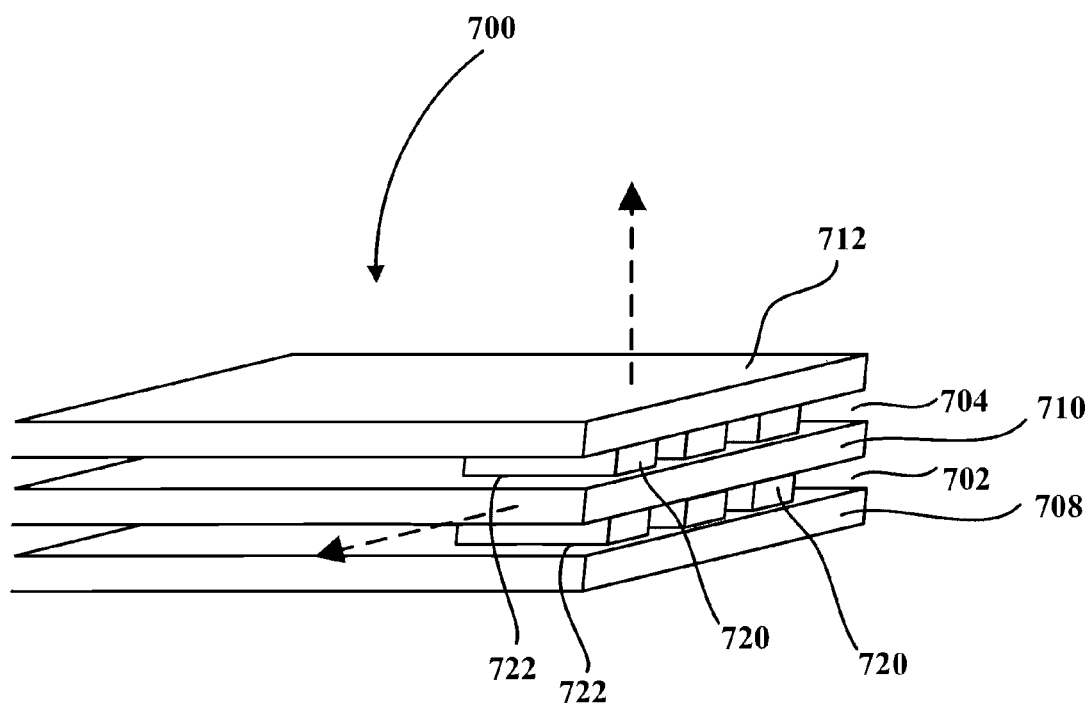
FIG. 8 is a perspective view of a stacked light-emitting structure comprising edge emitting elements in accordance with a further embodiment of the present invention.
Figure 11:
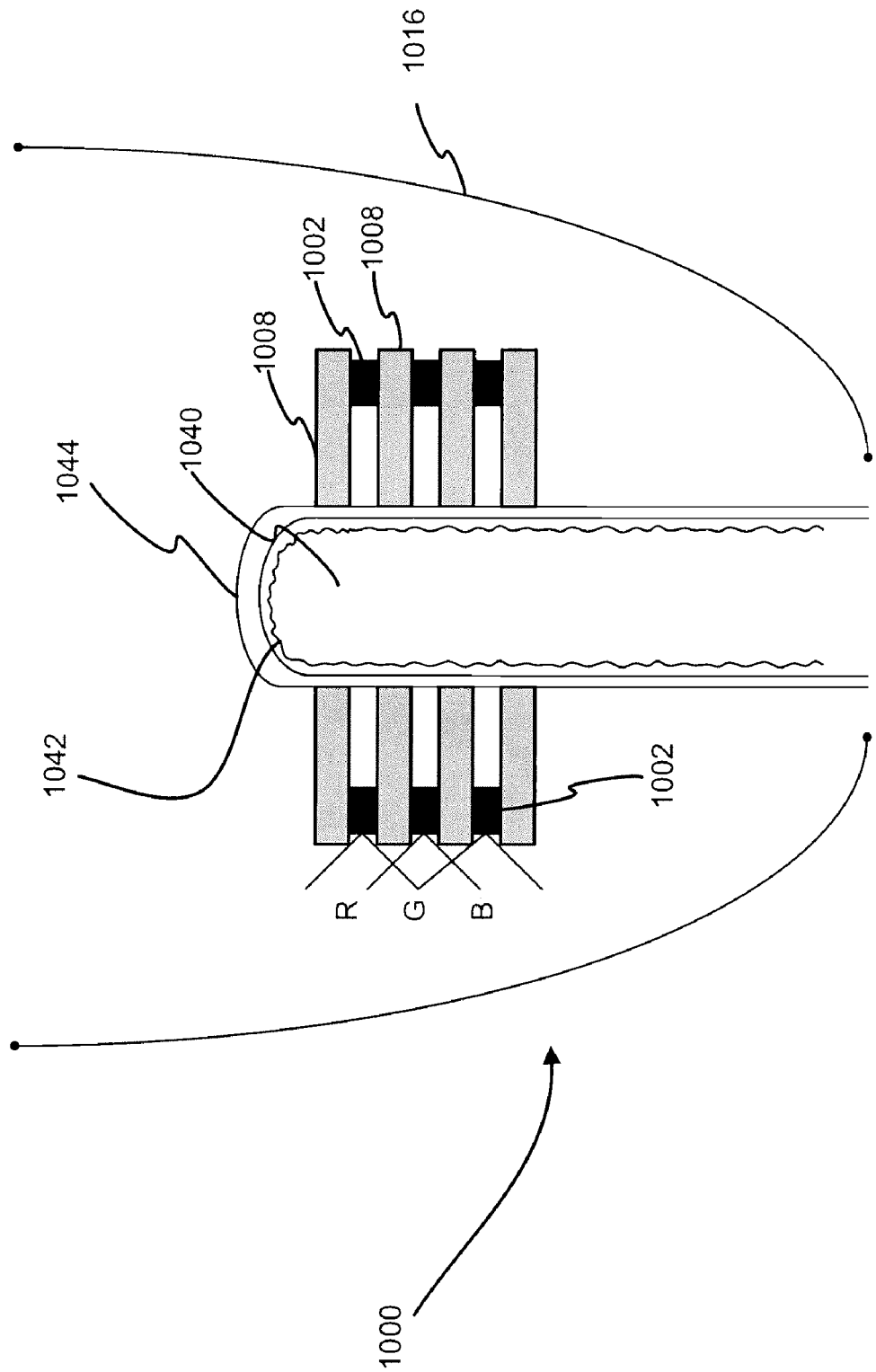
FIG. 11 is a side view of a light source comprising edge emitting elements in accordance with one embodiment of the present invention.

In another embodiment, the light source comprises edge emitting elements that provide four or more output spectra/colours. For instance, the light source may comprise four edge emitting elements, or groups, arrays or layers thereof, having different output spectra/colours, namely for example red, amber, green and blue (e.g., see FIG. 3). Again, the coloured outputs of the respective edge emitting elements can be collected and mixed via a suitable optical means to provide a combined output spectrum, such as white light. Alternatively, as presented above, the light source may comprise one or more arrays of edge emitting elements, each array having a respective general output spectrum or wavelength. Namely, as seen in FIGS. 7, 8 and 11, the edge emitting elements may be stacked in a configuration to provide, between every two heat extractors, two or more edge emitting elements that, depending on the application for which the light source is developed, may be configured to emit light having a substantially same or similar output spectrum. In one embodiment, each edge emitting element of a given light-emitting layer provides a substantially same or similar output spectrum. In another embodiment, three light-emitting layers are provided to respectively produce light of red, green and blue colours (e.g., see FIGS. 1, 5 and 11). In yet another embodiment, four light-emitting layers are provided to respectively produce light of red, amber, green and blue colours (e.g., see FIGS. 3 and 6). In a further embodiment, light produced by a given light-emitting layer is collected and mixed with light produced by the other light-emitting layers to produce a combined optical effect. Collection and mixing of light produced by individual edge emitting elements and/or light-emitting layers may be provided by a combination of optical means such as reflectors, filters, lenses, collimators, diffusers, and the like.

In another embodiment, the respective emission spectra of a plurality of edge emitting elements are overlapped such that a combined output of the edge emitting elements forms a continuous non-zero spectrum over a wavelength range which is wide in comparison to the wavelength range of a single edge emitting element, for example. The combined output may span, for example, from substantially blue to red wavelengths, provided, for example, from two, three, four or more individual output spectra.

The person of skill in the art will readily understand that various optical devices and components may be used within, or in conjunction with, the various embodiments of the disclosed light source, to provide a desired effect. For instance, stacked and/or staggered filter combinations may be used to adequately combine and mix the various coloured outputs of the edge emitting elements. Various reflector configurations may also be considered, namely to collect and redirect light emitted from each edge emitting element, or group, array or layer thereof. For example, reflectors may be planar, conical, parabolic, compound parabolic, asymmetric compound parabolic, horn shaped, polygonal section, and/or a combination thereof, or of other such forms known in the art. Also, collimators, lenses and the like may be used to shape and redirect the light source output, while diffusers and the like may be used to mix and diffuse the various outputs.

The person of skill in the art will further understand that various optical manipulations of the light output from the various edge emitting elements may also be provided via various structural and/or configurational attributes of the edge emitting elements or light-emitting layers themselves. For instance, various reflective and anti-reflective coatings may be applied to these elements (e.g., to non-emitting surfaces and/or light-emitting edges) to redirect light emitted therefrom in accordance with a desired output directionality. Etched and/or integrated micro-mirror, lens and/or waveguiding structures may also be associated or provided with individual elements/layers.

For instance, in one embodiment, a diffuser may be applied directly to an optical component of the light source.

In another embodiment, wavelength conversion material may be coated on the one or more light-emitting edges of the one or more edge emitting elements. Alternatively, a wavelength conversion material may be coated on reflecting optics, diffusers and/or encapsulants of a given embodiment.

Other such considerations should be apparent to the person of skill in the art and are thus not considered to depart from the general scope and nature of the present disclosure.

Driving Means

The light source also comprises driving means for driving the one or more edge emitting elements to emit light, either in accordance with a substantially same or similar emission spectrum for all edge emitting elements, or in accordance with respective emission spectra for each edge emitting element or subgroup thereof.

In general, the driving means can be configured to apply a potential difference across the various edge emitting elements of the light source. This potential difference is generally applied between two nominally non-emitting surfaces of the edge emitting element, for example, the surfaces thermally coupled to respective heat extractors. As such, in one embodiment, the driving means is configured to apply a driving voltage to each edge emitting element via the heat extractors thermally coupled thereto. For instance, in an embodiment wherein each edge emitting element is operated individually, a given edge emitting element may be driven by a voltage applied directly between the two heat extractors of this given edge emitting element. Alternatively, in an embodiment wherein the edge emitting elements are configured in a stacked light-emitting structure, the edge emitting elements may be driven by a voltage applied between the two outermost heat extractors, providing a stack of light-emitting layers operated in series.

As will be apparent to the person of skill in the art, various drive configurations may be considered depending on the application for which the light source is to be used. For instance, if each light-emitting layer within a given stacked light-emitting device is to be operated independently, then leads may be integrated between each light-emitting layer and their respective heat extractor layers using a thin layer of electrically insulating material that has a high thermal conductivity. This configuration would allow for proper heat dissipation from each light-emitting layer to their respective heat extractor layers, while maintaining electrical isolation for each light-emitting layer.

In one embodiment, a light source could comprise multiple stacks, and each stack could comprise a different emission wavelength. Each stack could be driven in series, for example, and driven independently or interdependently of the others.

In another embodiment, edge emitting elements between a same pair of heat extractors could be driven in parallel.

In general, various combinations of series and parallel connections may be considered herein, without departing from the general scope and nature of the present disclosure. Example driving configurations, which may allow the edge emitting elements of a given light source to be driven independently, as a group, or in various subgroups or combinations, are depicted in FIGS. 16A to 16D. Other such configurations should be apparent to the person of skill in the art and are thus not considered to depart from the general scope and nature of the present disclosure.

Optional Feedback System

In accordance with an embodiment of the present invention, the light source may further comprise an optional feedback system (e.g., see FIG. 9), wherein an output of the light source may be monitored, either directly or indirectly, and voltages driving the individual edge emitting elements, or arrays or combinations thereof, adjusted accordingly via respective drivers to control and maintain a desired output. Such a feedback system may be used, for instance, to maintain a desired output (e.g., colour, chromaticity, intensity, power, luminous flux output, etc.) despite fluctuations in the outputs of individual edge emitting elements (e.g., output power, peak wavelength, spectral broadening, etc.) due to ageing, temperature variations and the like, and despite interference from other sources.

For instance, in an embodiment of the light source comprising three or more edge emitting elements, or groups, arrays or layers thereof, having different emission spectra (e.g., RGB, RAGB, etc.), the feedback system may be configured to monitor output characteristics of the light source (e.g., output spectrum, chromaticity, colour quality (CQS), colour rendering index (CRI), luminous efficacy, etc.) and adjust, when needed, the driving voltages, currents, etc., of each edge emitting element, or group, array or layer thereof, to adjust their output and thereby control the combined output of the light source.

Alternatively, the optional feedback system may be configured to adjust various components of the output optics (e.g., reflectance of filters, positioning of reflectors/lenses, etc.) to adjust the optical output while maintaining a substantially constant driving of the light source's various edge emitting elements. It will be readily understood by the person of skill in the art that other similar feedback systems may be considered to provide a like effect, and as such, should not be considered to depart from the general scope and nature of the present disclosure.

The invention will now be described with reference to specific examples. It will be understood that the following examples are intended to describe embodiments of the invention and are not intended to limit the invention in any way.

EXAMPLES

Example 1

Figure 2:
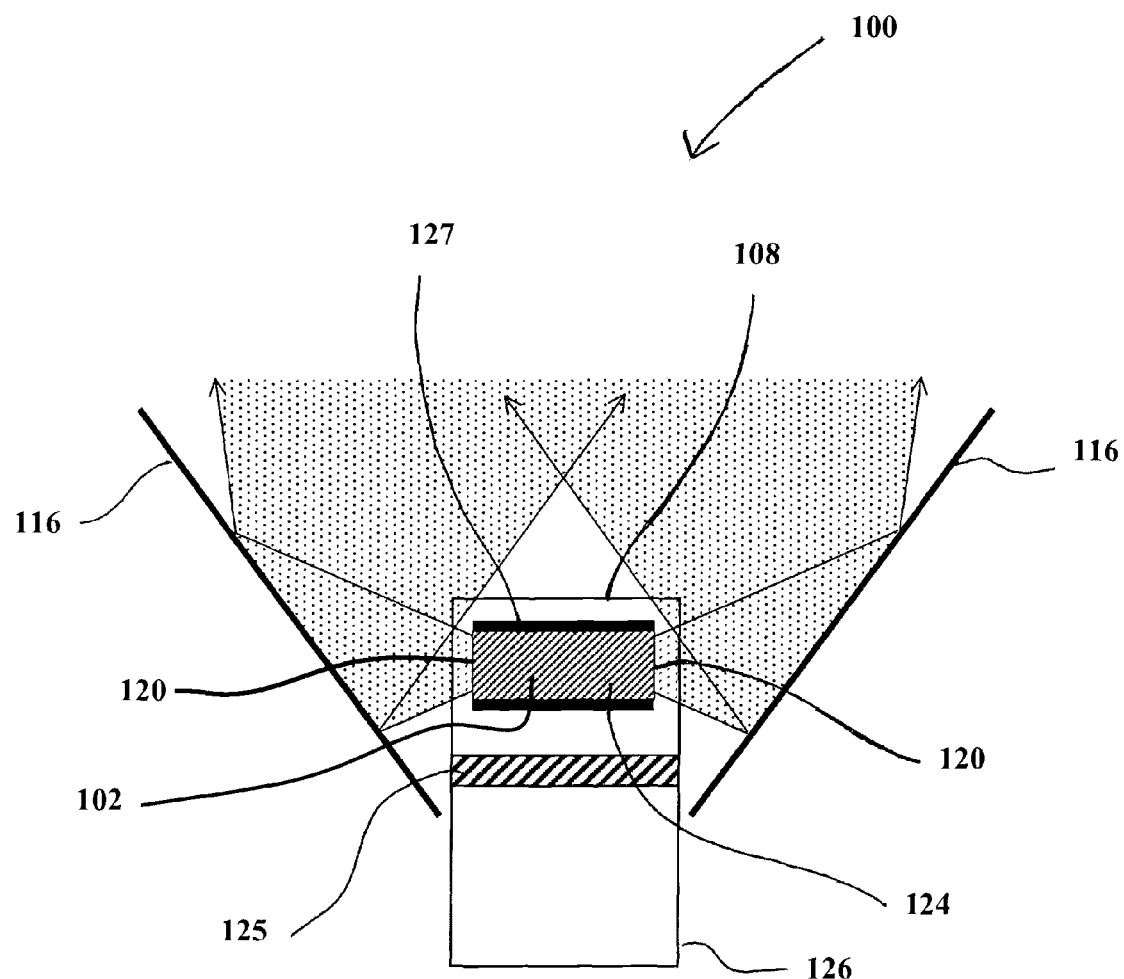
FIG. 2 is a cross-sectional view of the light source of FIG. 1 taken along line 2-2 thereof.

With reference now to FIGS. 1 and 2, a light source, generally referred to using the numeral 100, and in accordance with one embodiment of the present invention, will now be described. The light source 100 generally comprises three edge emitting elements, as in elements 102, and a number of heat extractors thermally coupled thereto, as in extractors 108. It will be appreciated that more or less edge emitting elements may be considered in the present example, the number thereof depicted in FIGS. 1 and 2 being examples only. The stacked light-emitting structure defined by the edge emitting elements and heat extractors is generally disposed along an axis perpendicular to an optical axis of the light source 100, that is perpendicular to a general output axis thereof Optical means, such as reflectors 116 are also provided to collect, mix and redirect light emitted by the edge emitting elements 102 to provide a desired optical output along that optical axis. Driving means (not shown) are also provided to drive the edge emitting elements.

As illustrated herein, each edge emitting element comprises two respective light-emitting edges, as in edges 120, and two larger non-emitting surfaces, as in surfaces 122, from which heat may be extracted and dissipated via the heat extractors 108. As illustrated in FIG. 2, light is generated within active area 124 of the edge emitting element. Guiding of the emission to the emitting edges 120 can occur, for example, via coatings 127 along the upper and lower edges of the edge emitting element, and also via coatings on the two larger non emitting surfaces 122.

In the illustrated embodiment of FIGS. 1 and 2, the heat extractors 108 comprise heat sinks, namely metal plates or structures (e.g., copper, aluminium, aluminium nitride, copper-tungsten etc.), each thermally coupling the adjacent non-emitting surfaces 122 of adjacent edge emitting elements 102. The heat extractors are also mutually thermally coupled to a heat sinking base 125 and extension 126, the latter of which providing a support for the edge emitting elements in the light source 100. As will be readily understood by the person of skill in the art, the heat sinking base 125 may also lead to a further heat management system, such as an active and/or passive cooling system, to further control and maintain operation of the edge emitting elements at a desired or optimal operating temperature. A person of skill in the art will also understand that thermally and or electrically distinct heat extractors for each edge emitting element may also be considered without departing from the general scope and nature of the present disclosure.

The light source 100 also comprises driving means (not shown) for driving the edge emitting elements. In the illustrated embodiment, the edge emitting elements emit light at respective wavelengths, generally in accordance with respective emission spectra. For example, the light source 100 is comprised of three edge emitting elements 102, namely a red edge emitting element, a green edge emitting element and a blue edge emitting element, the respective outputs of which being collected and mixed via the reflectors 116 to provide a combined output spectrum, in this example optionally providing white light. Alternatively, a similar effect can be provided when the light source 100 is configured to include three or more arrays or layers of edge emitting elements, namely respective arrays or layers of red, green and blue edge emitting elements.

Example 2

Figure 3:
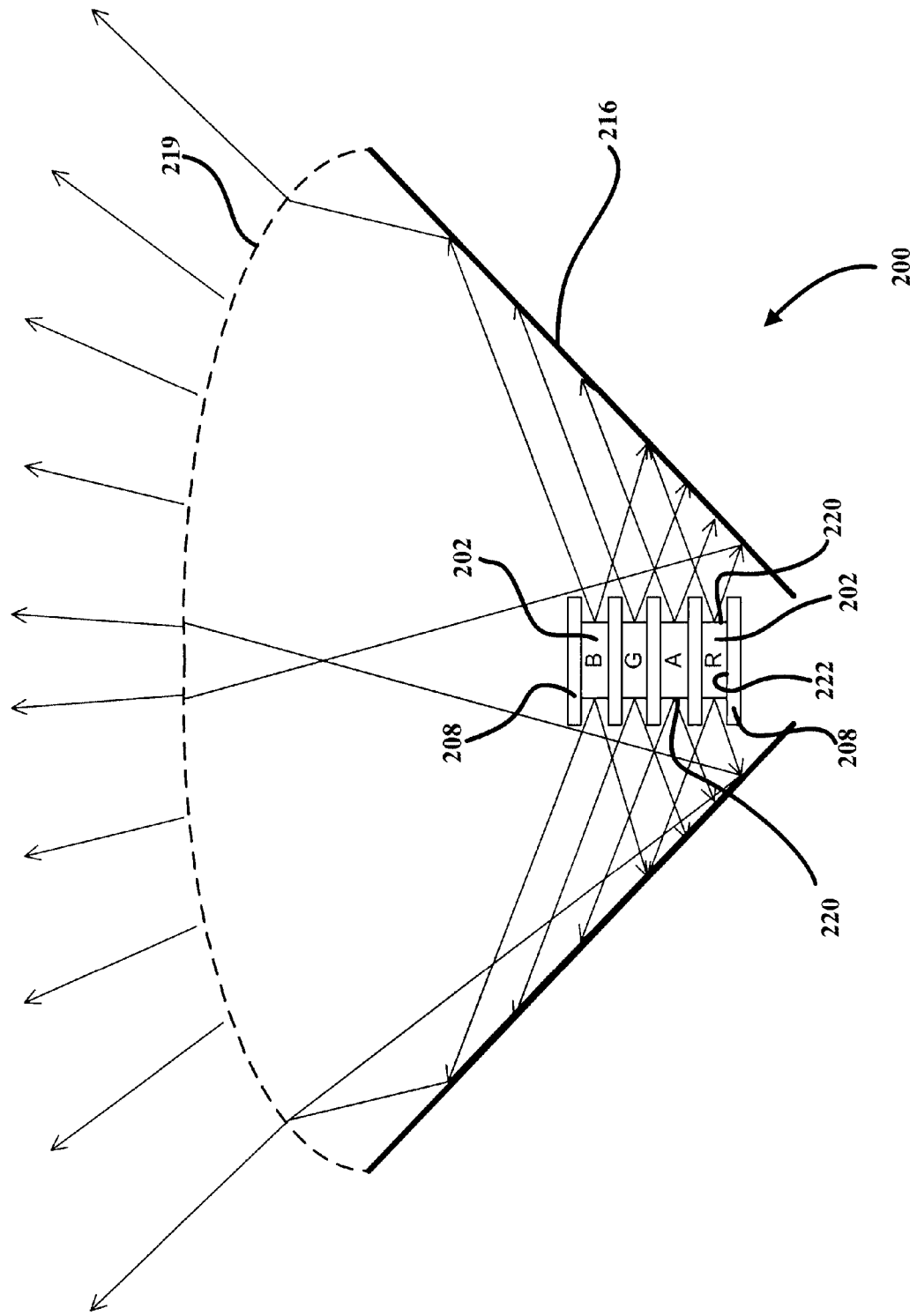
FIG. 3 is a cross-sectional view of a light source comprising edge emitting elements in accordance with one embodiment of the present invention.

FIG. 3 illustrates a light source 200, in accordance with another embodiment of the present invention, that generally comprises four edge emitting elements, as in element 202, and a number of heat extractors thermally coupled thereto, as in extractors 208. The stacked light-emitting structure defined by the edge emitting elements and heat extractors is generally disposed along an optical axis of the light source 200, that is a general output axis thereof Optical means, such as reflectors 216, and diffuser 219, are also provided to collect, mix and redirect light emitted by the edge emitting elements 202 to provide a desired optical output along that optical axis. Driving means (not shown) are also provided to drive the edge emitting elements.

As illustrated herein, each edge emitting element comprises two respective light-emitting edges, as in edges 220, and two larger non-emitting surfaces, as in surface 222, from which heat may be extracted and dissipated via the heat extractors 208.

In the illustrated embodiment of FIG. 3, the heat extractors 208 comprise heat sinks, namely metal plates or structures (e.g., copper, aluminium, aluminium nitride, copper-tungsten etc.), each thermally coupling the adjacent non-emitting surfaces 222 of adjacent edge emitting elements. As will be readily understood by a person of skill in the art, the heat extractors may be configured to lead to a further heat management system, such as an active and/or passive cooling system, to further control and maintain operation of the edge emitting elements at a desired or optimal operating temperature. A person of skill in the art will also understand that thermally and or electrically distinct heat extractors for each edge emitting element may also be considered without departing from the general scope and nature of the present disclosure.

The light source 200 also comprises driving means (not shown) for driving the edge emitting elements. In the illustrated embodiment, the edge emitting elements emit light at respective wavelengths, generally in accordance with respective emission spectra. For example, the light source 200 is comprised of four edge emitting elements 202, namely a red edge emitting element, an amber edge emitting element, a green edge emitting element and a blue edge emitting element, the respective outputs of which being collected and mixed via reflectors 216 and diffuser 219 to provide a combined output spectrum, in this example optionally providing white light. Alternatively, the light source 200 may comprise four or more arrays or layers of edge emitting elements, namely respective arrays or layers of red, amber, green and blue edge emitting elements, to provide a similar effect.

Example 3

Figure 4:
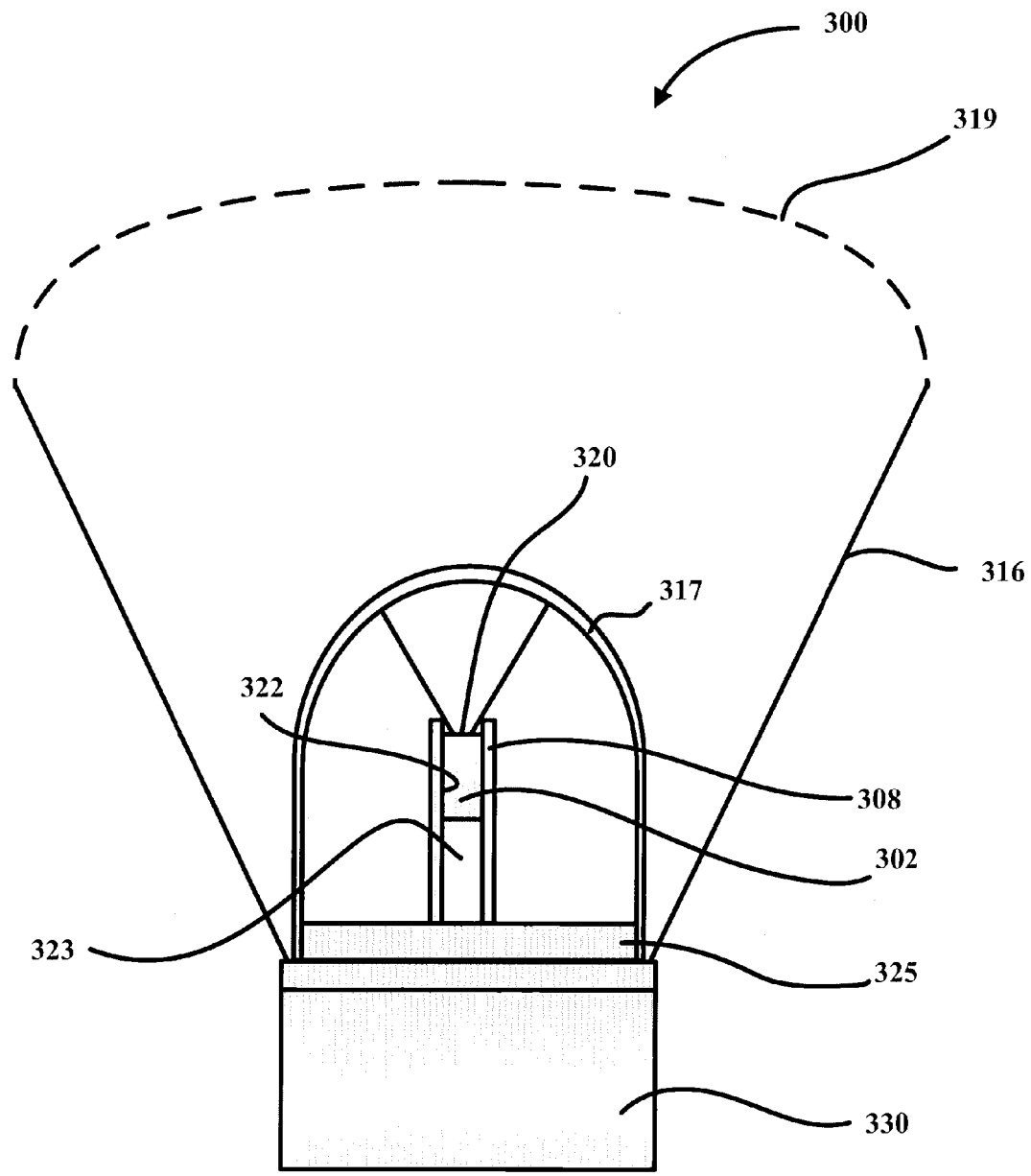
FIG. 4 is a cross-sectional view of a light source comprising one edge emitting element in accordance with another embodiment of the present invention.

FIG. 4 illustrates a light source 300, in accordance with another embodiment of the present invention, that generally comprises one edge emitting element 302, or a linear array thereof, and a pair of heat extractors thermally coupled thereto, as in extractor 308. Optical means, such as reflectors 316, lens 317 and diffuser 319, are also provided to collect, mix and redirect light emitted by the edge emitting element 302 to provide a desired optical output. Driving means are also provided, namely through base 330, to drive the edge emitting element 302. In one embodiment, the volume enclosed by lens 317 can be filled with an encapsulant, for example. Also, the volume between the heat extractors 308 which is not occupied by the edge emitting element 302 (e.g. volume 323), may optionally contain a thermally conductive ceramic for improved heat extraction, for example.

As illustrated herein, the edge emitting element 302 comprises a light-emitting edge 320 and two larger non-emitting surfaces 322 from which heat may be extracted and dissipated via the heat extractors 308.

In the illustrated embodiment of FIG. 4, the heat extractors 308 comprise a pair of heat sinks, namely metal plates or structures (e.g., copper, aluminium, aluminium nitride, copper-tungsten etc.), thermally coupling the non-emitting surfaces 322 of edge emitting element 302 with a heat sinking base 325. As will be readily understood by a person of skill in the art, the heat extractors 308 and/or heat sinking base 325 may be thermally coupled to a further heat management system, such as an active and/or passive cooling system, to further control and maintain operation of the edge emitting element 302 at a desired or optimal operating temperature.

Example 4

Figure 5:
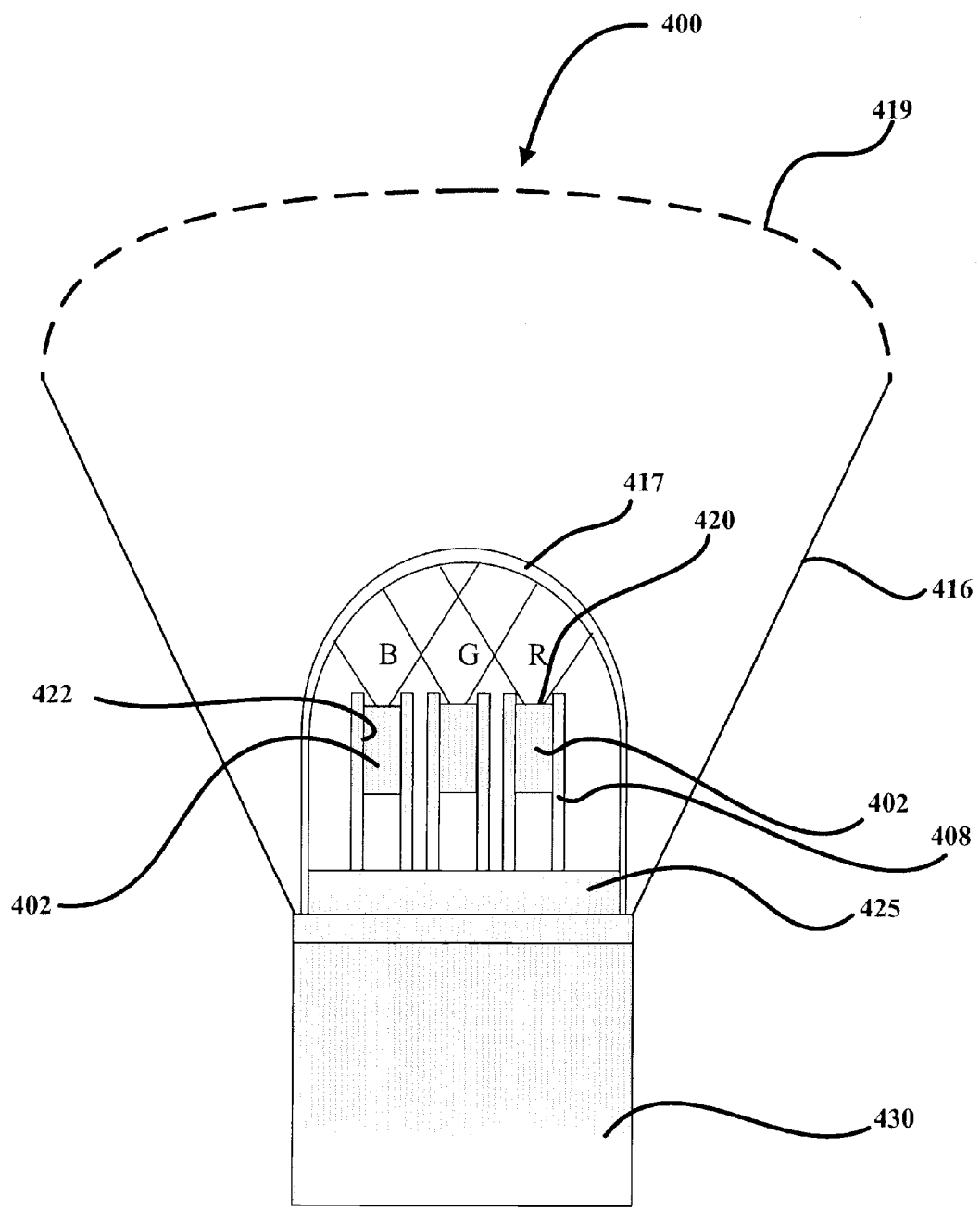
FIG. 5 is a cross-sectional view of a light source comprising three edge emitting elements in accordance with another embodiment of the present invention.

FIG. 5 illustrates a light source 400, in accordance with another embodiment of the present invention, that generally comprises three edge emitting elements, as in elements 402, each one of which is thermally coupled between a pair of heat extractors, as in extractor 408. Optical means, such as reflectors 416, lens 417 and diffuser 419, are also provided to collect, mix and redirect light emitted by the edge emitting elements 402 to provide a desired optical output. Driving means are also provided, namely through base 430, to drive the edge emitting element 402

As illustrated herein, each edge emitting element comprises a respective light-emitting edge, as in edges 420, and two larger non-emitting surfaces, as in surfaces 422, from which heat may be extracted and dissipated via the heat extractors 408.

In the illustrated embodiment of FIG. 5, the heat extractors 408 comprise heat sinks, namely metal plates or structures (e.g., copper, aluminium, aluminium nitride, copper-tungsten etc.), each pair of which thermally coupling the non-emitting surfaces 422 of respective edge emitting elements 402 to a heat sinking base 425. As will be readily understood by a person of skill in the art, the heat extractors 408 and/or heat sinking base 425 may be thermally coupled to a further heat management system, such as an active and/or passive cooling system, to further control and maintain operation of the edge emitting elements 402 at a desired or optimal operating temperature. A person of skill in the art will also understand that thermally and or electrically distinct heat extractors for each edge emitting element may also be considered without departing from the general scope and nature of the present disclosure.

The light source 400 also comprises driving means (e.g., provided via base 430) for driving the edge emitting elements 402. In the illustrated embodiment, the edge emitting elements 402 emit light at respective wavelengths, generally in accordance with respective emission spectra. For example, the light source 400 is comprised of three edge emitting elements 402, namely a red edge emitting element, a green edge emitting element and a blue edge emitting element, the respective outputs of which being collected and mixed via reflectors 416, lens 417 and diffuser 419 to provide a combined output spectrum, in this example optionally providing white light.

In the embodiment of FIG. 5, the edge emitting elements may be driven independently of each other, for example, as facilitated by the separation between heat extractors of neighbouring edge emitting elements.

In another embodiment, a plurality of edge emitting elements in each colour could be provided, the elements of a given colour all being positioned, for example, between a same pair of heat extractors. In general, this could provide for arrangement the edge emitting elements in a 2D array.

Example 5

Figure 6:
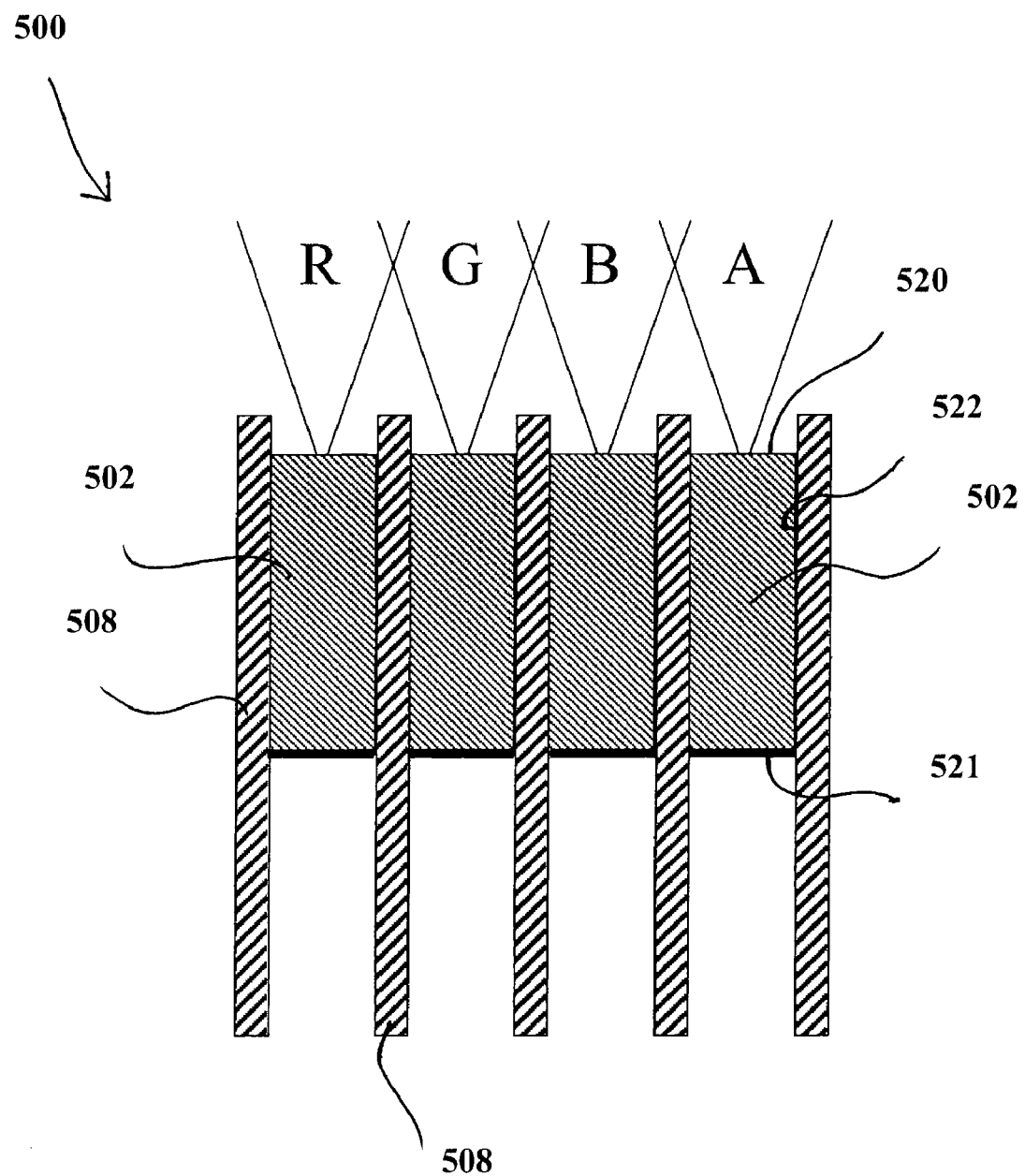
FIG. 6 is a cross-sectional view of a stacked light-emitting structure comprising edge emitting elements in accordance with a further embodiment of the present invention.

FIG. 6 illustrates a stacked light-emitting structure 500 in accordance with another embodiment of the present invention. The stacked light-emitting structure 500 is generally for use in a light source having driving means therefor, as in light sources 100, 200, 300 and 400 of FIGS. 1 and 2, 3, 4 and 5 respectively, and other such light sources, and generally comprises four edge emitting elements, as in elements 502, and a number of heat extractors thermally coupled thereto, as in extractors 508.

As illustrated herein, each edge emitting element comprises one respective light-emitting edge, as in edge 520, and two larger non-emitting surfaces, as in surface 522, from which heat may be extracted and dissipated via the heat extractors 508. The edges opposite light-emitting edges 520 are each coated with a reflective coating 521, thereby operatively increasing respective emissions from edges 520. An anti-reflection coating may also be provided on edges 520 to further increase an emission efficiency thereof.

In the illustrated embodiment of FIG. 6, the heat extractors 508 comprise heat sinks, namely metal plates or structures (e.g., copper, aluminium, aluminium nitride, copper-tungsten etc.), each thermally coupling the adjacent non-emitting surfaces 522 of adjacent edge emitting elements. Alternatively, the heat extractors may comprise heat pipes or macrochannel coolers or the like to provide a similar effect. As will be readily understood by the person of skill in the art, the heat extractors may be configured to lead to a further heat management system, such as an active and/or passive cooling system, to further control and maintain operation of the edge emitting elements at a desired or optimal operating temperature. A person of skill in the art will also understand that thermally and or electrically distinct heat extractors for each edge emitting element may also be considered without departing from the general scope and nature of the present disclosure.

When the stacked light-emitting structure is driven, for example via a set of leads (not shown) disposed along, or integrated within, the heat extractors 508, the edge emitting elements thereof emit light at respective wavelengths, generally in accordance with respective emission spectra. For example, the stacked light-emitting structure 500 is comprised of four edge emitting elements 502, namely a red edge emitting element, an amber edge emitting element, a green edge emitting element and a blue edge emitting element. By combining the outputs of each edge emitting element using appropriate optics, various effects, such as colour mixing, beam shaping, and/or temporally changing patterns, to name a few, may be generated.

Example 6

FIG. 7 illustrates a laterally stacked light-emitting structure 600 in accordance with another embodiment of the present invention. The light-emitting structure 600 is generally for use in a light source having driving means therefor, as in light sources 100, 200, 300 and 400 of FIGS. 1 and 2, 3, 4 and 5 respectively, and other such light sources, and generally comprises a layered array of edge emitting elements forming light-emitting layer 602, and two substantially planar heat sinks coupled thereto forming heat extractor layers 608 and 610. The light-emitting structure 600 may also comprise integrated output optical means, such as integrated lens 617 or the like (illustrated as partially cut away herein to identify edge emitting elements disposed there behind), to combine and/or redirect light emitted by the edge emitting elements of light-emitting layer 602.

As illustrated herein, each edge emitting element comprises one respective light-emitting edge, as in edge 620, and two larger non-emitting surfaces, as in surface 622, from which heat may be extracted and dissipated via the heat extractor layers 608 and 610. The edges opposite light-emitting edges 620 are each coated with a reflective coating, thereby operatively increasing respective emissions from edges 620. The edges perpendicular to the emission edge may also be reflectively coated to reduce losses, for example. An anti-reflection coating may also be provided on edges 620 to further increase an emission efficiency thereof.

When driven, the edge emitting elements of the light-emitting structure 600 may emit light at respective wavelengths, generally in accordance with respective emission spectra. By combining the output of each light-emitting layer using appropriate optics, various desired beam characteristics, in chromaticity and/or beam distribution, for example, may be generated. Alternatively, as discussed above, each edge emitting element of light-emitting layer 602 may be configured to emit light in accordance with a substantially same or similar emission spectrum. Such a configuration may be useful when combining in a single light source different stacked light-emitting structures having different emission spectra, or again when a single output light source is desired.

Example 7

FIG. 8 illustrates a 2 dimensionally stacked light-emitting structure 700 in accordance with another embodiment of the present invention. The stacked light-emitting structure 700 is generally for use in a light source having driving means therefor, as in light sources 100, 200, 300 and 400 of FIGS. 1 and 2, 3, 4 and 5 respectively, and other such light sources, and generally comprises two or more layered arrays of edge emitting elements, namely forming light-emitting layers 702, 704, etc., and a number of heat extractors thermally coupled thereto, namely forming heat extractor layers 708, 710, 712, etc.

As illustrated herein, each edge emitting element comprises one respective light-emitting edge, as in edges 720, and two larger non-emitting surfaces, as in surfaces 722, from which heat may be extracted and dissipated via the heat extractor layers 708, 710, 712, etc. The edges opposite light-emitting edges 720 are each coated with a reflective coating, thereby operatively increasing respective emissions from edges 720. An anti-reflection coating may also be provided on edges 720 to further increase an emission efficiency thereof.

In the illustrated embodiment of FIG. 8, the heat extractor layers 708, 710, 712, etc. are comprised of heat sinks or the like, each thermally coupling the adjacent non-emitting surfaces 722 of adjacent edge emitting layers 702, 704, etc.

When driven, the edge emitting elements of the stacked light-emitting structure 700 emit light at respective wavelengths, generally in accordance with respective emission spectra. For example, the stacked light-emitting structure 700 is comprised of two or more light-emitting layers 702, 704, etc., each respectively emitting light at a given wavelength. By combining the output of each light-emitting layer using appropriate optics, various effects, such as colour mixing, beam shaping, and temporally changing patterns, to name a few, may be generated. Alternatively, as discussed above, each light-emitting layer may be configured to emit light in accordance with a substantially same or similar emission spectrum. Such a configuration may be useful when combining in a single light source different stacked light-emitting structures having different emission spectra, or again when a single wavelength or common spectrum light source is desired.

Example 8

Figure 9:
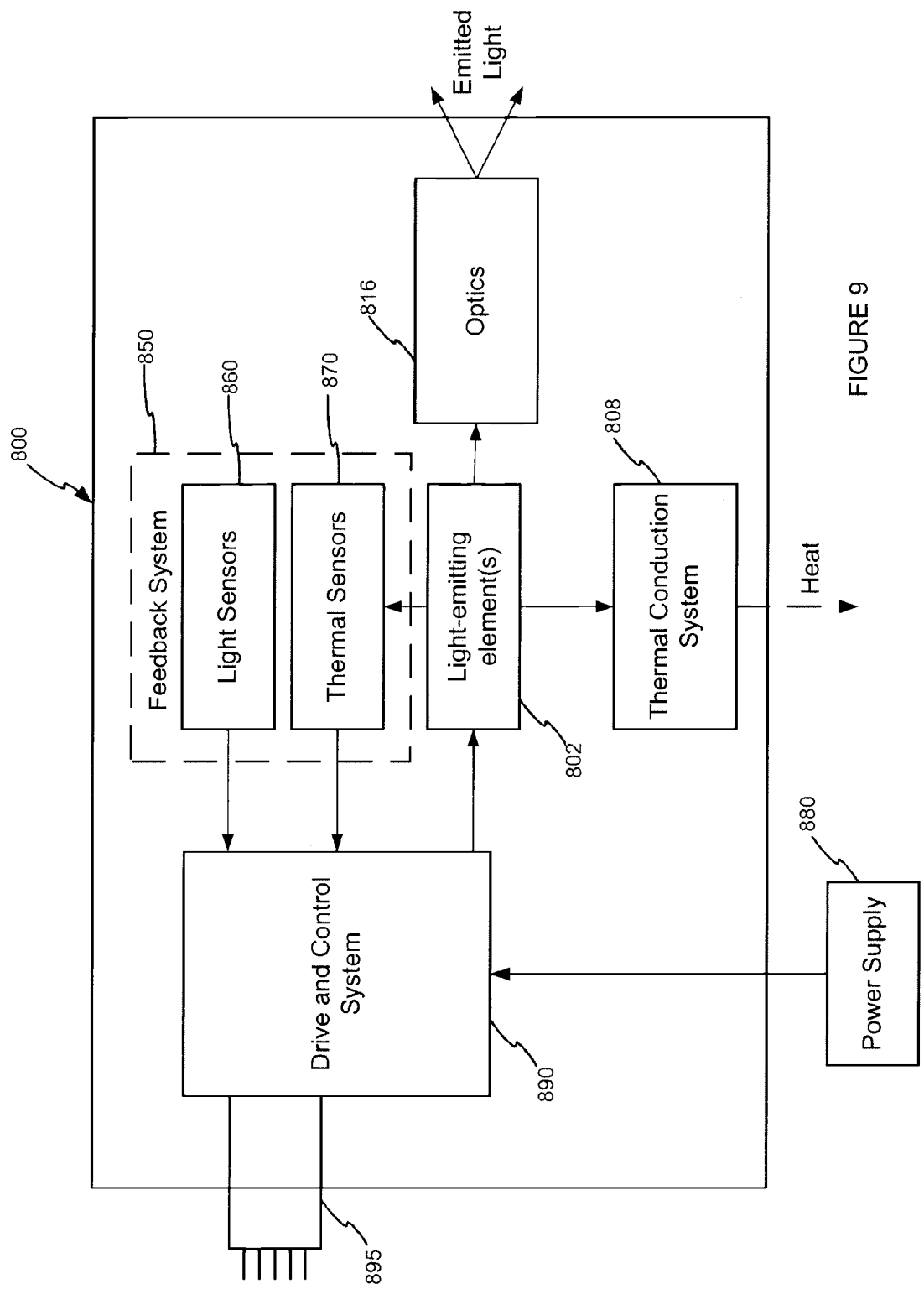
FIG. 9 is a diagrammatical representation of a system comprising a light source and an optional feedback system in accordance with a further embodiment of the present invention.

FIG. 9 provides a diagrammatical representation of a light source 800 comprising a feedback control system 850 operable to control and manage an output of the respective edge emitting elements thereof (schematically illustrated as block 802), as in one or more diodes in series, parallel, or combined series/parallel arrangement to provide a desired combined output (examples of diode wiring diagrams are shown in FIGS. 16A to 16D). The feedback system 850 may be designed to monitor an output of each edge emitting element 802, or each group thereof, for example via various optical/electrical monitoring means (e.g., light sensor(s) 860) and provide a feedback loop to a drive and control system 890, for example, which adjusts respective driving means for each edge-emitting element 802, or group thereof, to maintain each output within a prescribed range that produces the desired combined output.

In this example, the light source 800 generally further comprises an external power source 880 for providing power to the lighting source 800 wherein this provided power is regulated by the drive and control system 890. This power regulation can include the conversion of the supplied external power to a desired input power level that can be determined based on characteristics of the edge emitting elements 802 within the light source 800, for example. In addition to power conversion, the drive and control system 890 may provide a means for controlling the transmission of control signals to the edge emitting elements 802 thereby controlling their activation. The drive and control system 890 can receive input data from within the lighting source 800, for example from the feedback system 850, and/or may receive external input data from other light sources or other controlling devices. An optional communication port 895 can provide the drive and control system 890 with the capability for both input and output of signals to and from the light source 800, respectively.

The feedback system 850 within the light source 800 can comprise one or more forms of detectors or other similar devices. For example an optical sensor 860 and/or thermal sensor 870 can be integrated into the feedback system 850. The optical sensor 860 can detect and provide information to the drive and control system 890 that can relate to the luminous flux and chromaticity of the illumination generated by the light-emitting elements 802 and additionally can relate to ambient daylight readings, for example. This form of information can enable the drive and control system 890 to modify the activation of the light-emitting elements 802 within the light source 800 in order that a desired illumination is generated. A thermal sensor 870 can detect the temperature of the substrate on which the light-emitting elements 802 are mounted, the temperature of one of or each of the light-emitting elements 802 and/or the temperature within the light source 800 itself, for example. This temperature information can be transferred to the drive and control system 890 thereby enabling the modification of the activation of the light-emitting elements 802 in order to reduce thermal damage of the light-emitting elements 802 due to overheating, for example, thereby improving the longevity thereof.

A thermal management system, depicted herein as a thermal conduction system 808, provides a system for transferring heat generated by the edge emitting elements 802 to a heat sink or other heat dissipation device. The thermal management system 808 generally comprises intimate thermal contact with the light-emitting elements 802 and provides a predefined thermal path for the heat to be transferred away from the light-emitting elements 802. Optionally, the thermal management system 808 may further provide a means for transferring heat away from the drive and control system 890.

The optical system 816 receives the illumination created by the light-emitting elements 802 and provides a means for efficient optical manipulation of this illumination. The optical system 816 can for example provide a means for the collection and/or collimation of luminous flux emitted by the light-emitting elements 802 and can provide colour mixing of the emission of multiple light-emitting elements 802, for example. The optical system 816 can also provide control over the spatial distribution of light emanating from the light source 800. In addition, the optical system 816 can provide a means for directing a fraction of the illumination to the optical sensor 860 in order to enable feedback signals to be generated which are representative of the characteristics of the illumination generated by the light source 800.

In one embodiment the drive and control system 890 of the light source 800 can operate independently of other external light sources and an external control system.

In another embodiment, the drive and control system 890 can receive input data from other light sources or an external control system via an optional communications port 895, wherein this data can include status signals, lighting signals, feedback information and operational commands, for example. The drive and control system 890 can equally transmit this externally received data or internally collected or generated data to other light sources or an external control system. This transmission of information can be enabled by the optional communication port 895 coupled to the drive and control system 890, for example.

A person of skill in the art will understand that various types and configurations of feedback control systems may be used in the present context without departing the general scope and nature of the present disclosure.

Example 9

Figure 10:
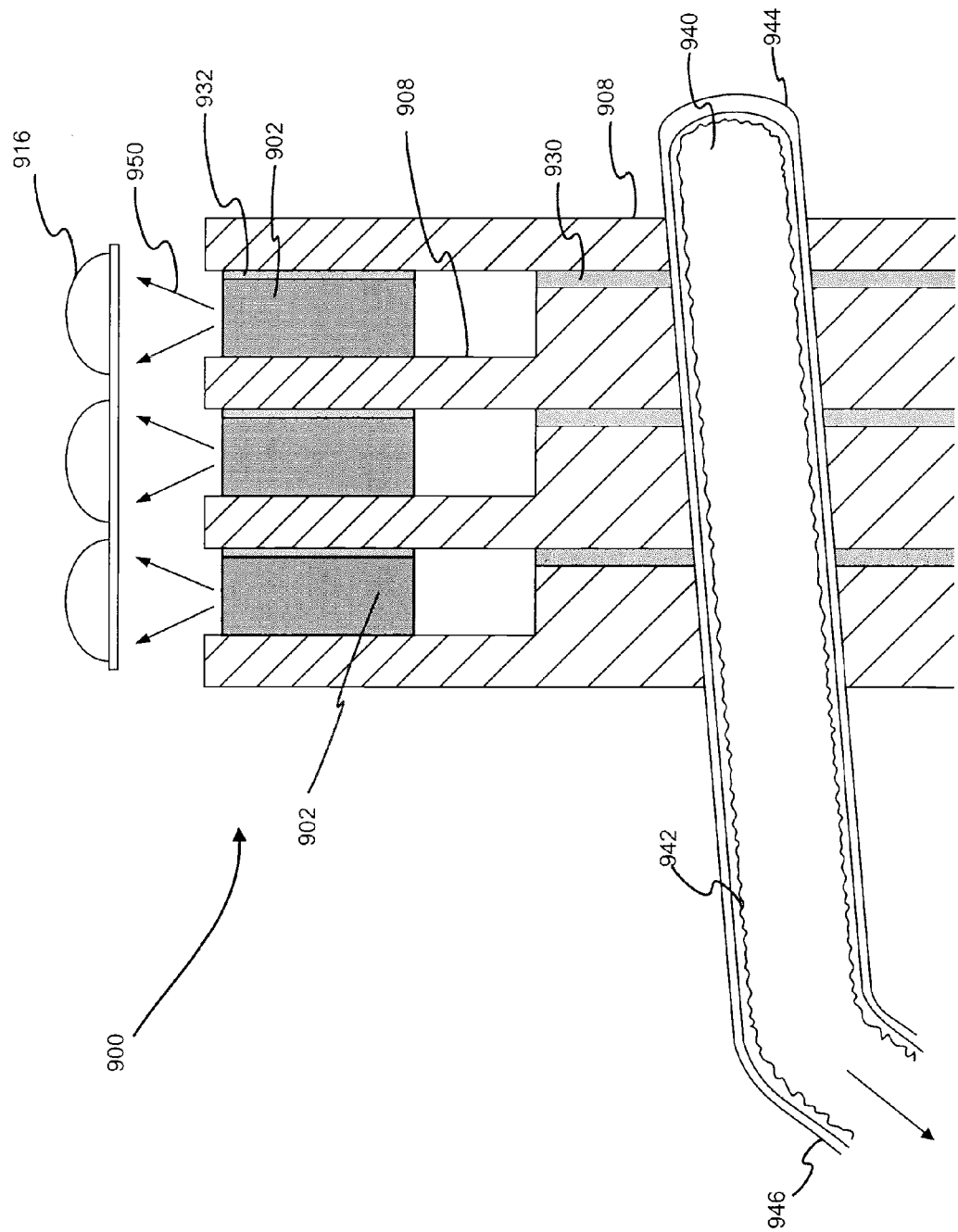
FIG. 10 is a sectional view of a stacked light-emitting structure comprising edge emitting elements in accordance with a further embodiment of the present invention.

In FIG. 10, and in accordance with an other embodiment of the present invention, there is provided a cross sectional view of a light source 900 comprising three edge emitting elements 902 operatively and thermally coupled between a set of heat extractors 908 (see for example, the heat extractor 1208' of FIG. 15B) each thermally interconnected in a stacked structure.

In this example, the heat extractors may comprise metal structures coated with thermally conducting and electrically insulating material 930. In this Figure, each edge emitting element 902 is mounted on the heat extractor 908 to its left, and coupled to the heat extractor 908 to its right (e.g. an adjacent heat extractor layer to which is mounted a respective edge emitting element) via an electrically and thermally conductive paste 932, or other such thermal and electrical connector. A rightmost heat extractor 908 completes the stacked structure.

The light source 900 further comprises a heat pipe 940 thermally coupled to each heat extractor 908 via respective holes provided therein through which the heat pipe 940 may be disposed. The heat pipe 940 is generally configured to comprise a wick 942, and is coated with a thermally conductive electrical insulator 944 thereby enabling heat extraction from the heat extractors 908 without effecting electrical connections therebetween. In one embodiment, the remote end 946 of the heat pipe 940 is connected to a heat dissipating means, such as a heat sink or the like. It will be appreciated that other heat dissipation systems and configurations, as will be apparent to the person of skill in the art, may be considered in this example without departing from the general scope and nature of the present disclosure.

The light source 900 of the present example further comprises a lenslet array 916 positioned so to intercept an optical output 950 of the edge emitting elements 902 so to provide a desired output. It will be appreciated that various positioning and disposition of the lenslet array 916, as for various other optical elements usable in the present context, may be considered herein, as will be apparent to the person of skill in the art, without departing from the general scope and nature of the present disclosure.

In this example, the stacked structure is electrically wired in series, with power supplied to the stack via the leftmost and rightmost heat extractors 908. It will be appreciated by the person of skill in the art that by using different combinations of electrically insulating and/or electrically conductive connections and materials to link adjacent heat extractors 908, different wiring configurations are possible. For example, each edge emitting element 902 could be driven independently via respective driving means, they could be driven in parallel, or driven in various parallel groups and/or subgroups of edge emitting elements driven in series, for example.

Example 10

Figure 12:
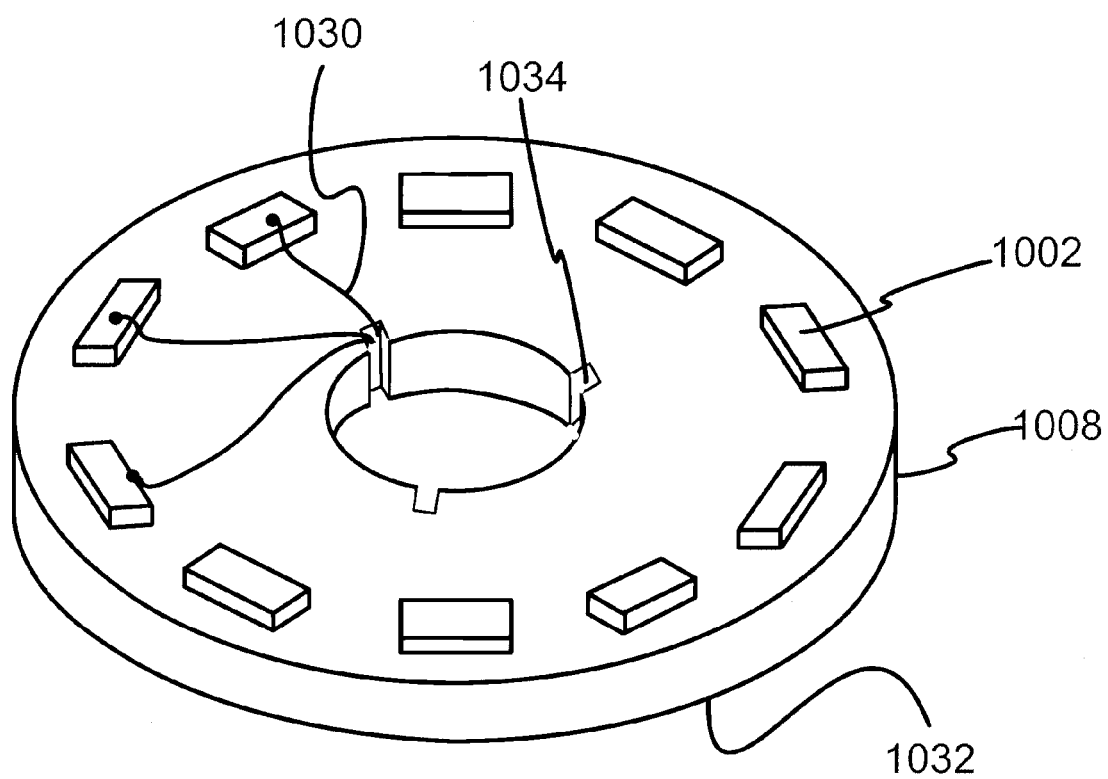
FIG. 12 is a top side view of an annular heat extractor carrying light emitting elements in accordance with one embodiment of the present invention.

With reference to FIGS. 11 and 12, and in accordance with another embodiment of the present invention, there is provided a light source 1000 (see FIG. 11) comprising successive layers of edge emitting elements 1002 operatively coupled between and disposed around successive annular heat extractors 1008. For example, the heat extractors 1008 may comprise metallic rings onto which are mounted several edge emitting elements 1002. The upper surfaces of the edge emitting elements 1002 may be connected, for example, via wire bonding and conductive traces 1030, whereas the lower surface 1032 of the annulus is covered with an electrically insulating layer, for example. Electrical wires passing through slots 1034 can be connected to the traces 1030 for driving the edge emitting elements 1002.

The light source 1000 further comprises a heat pipe 1040 comprising a wick 1042 and a thermally conductive and electrically insulating outer layer 1044. As in example 9, the heat pipe 1040 may be directed to a heat dissipating means, such as a heat sink or the like. It will be appreciated that other heat dissipation systems and configurations, as will be apparent to the person of skill in the art, may be considered in this example without departing from the general scope and nature of the present disclosure.

The light source 1000 of the present example further comprises a parabolic reflector 1016, and/or other such optical output elements, configured and disposed to redirect and collimate light emitted radially from the edge emitting elements 1002.

It will be appreciated that each of the edge emitting elements 1002 may be configured to emit light having a substantially same spectrum, or configured to emit light having different spectra, either from layer to layer, and/or within a same layer. In this example, each edge emitting elements of a same first, second and third layer are configured to emit red, green and blue light, respectively.

Figure 13:
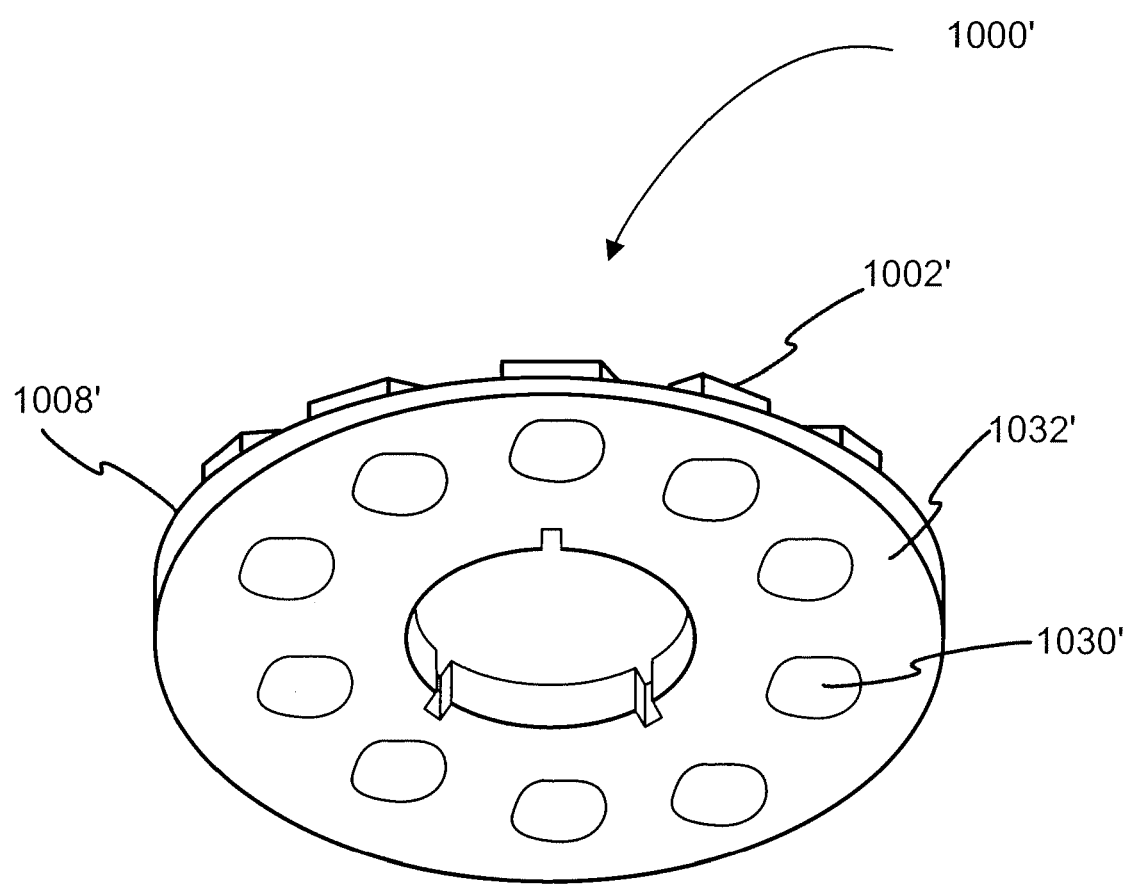
FIG. 13 is a bottom side view of an annular heat extractor carrying light emitting elements in accordance with one embodiment of the present invention.

With reference to FIG. 13 showing one of many possible alternatives to the example of FIGS. 11 and 12, a light source 1000' comprises electrically insulating heat extractors 1008', such as ceramic rings or the like, an upper and lower surface of which each comprising electrically conductive traces 1030' for supplying power to edge emitting elements 1002'. By stacking a number of successive heat extractor and edge emitting layers, as depicted in FIG. 11, heat may be extracted efficiently from both of the larger nominally non-emitting surfaces of the edge emitting elements 1002'.

Example 11

Figure 14:
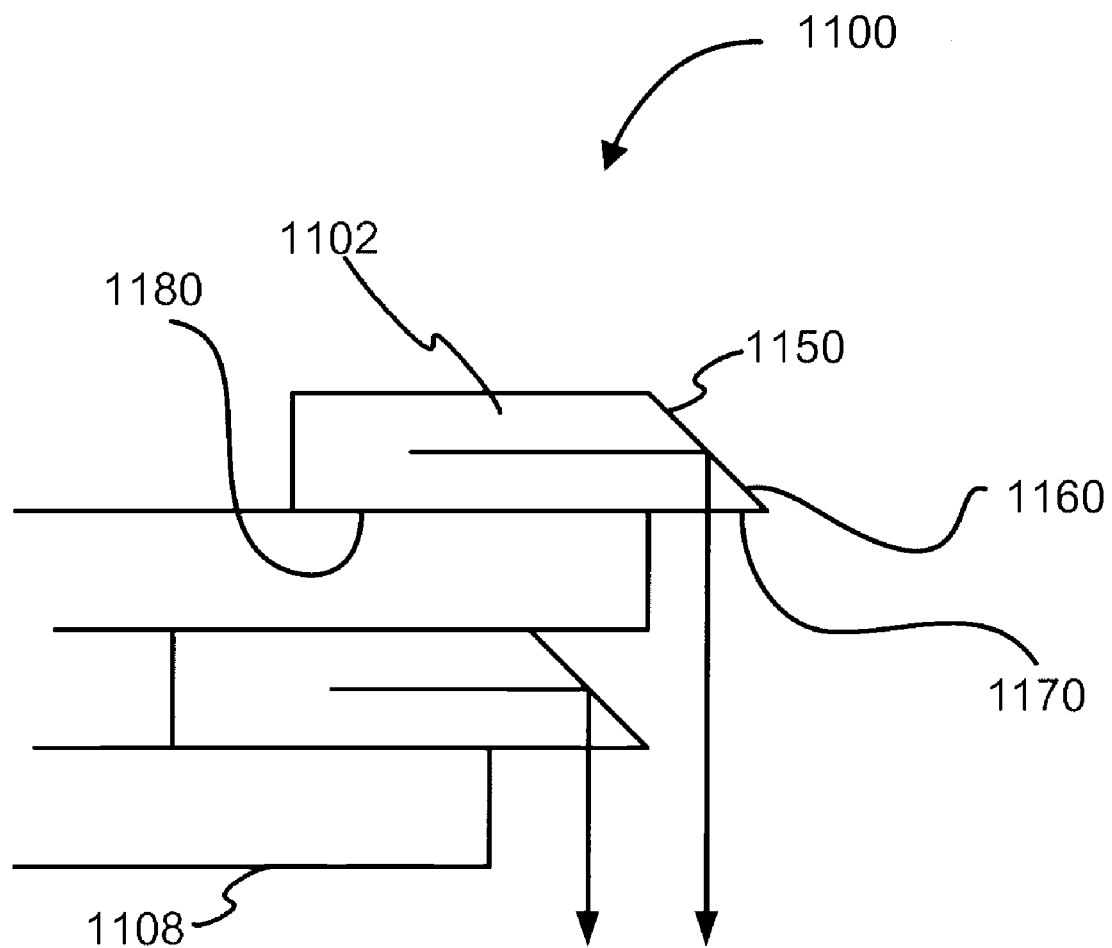
FIG. 14 is a diagrammatical view of a stack of light emitting elements in accordance with one embodiment of the present invention.

With reference to FIG. 14, and in accordance with another embodiment of the present invention, a partial view of a stacked light emitting structure 1100 is depicted to comprise a number of edge emitting elements 1102 each comprising a total internal reflection element 1150 disposed at an otherwise emitting edge thereof 1160, which redirects light that would otherwise be emitted from this edge, out of a small portion 1170 of a larger nominally non-emitting surface 1180 of the edge emitting element 1102 adjoining this edge. Accordingly, light can be emitted from the edge emitting element 1102 via an emitting edge thereof, which, in this embodiment, provides for a reflection of the generated light toward a portion of an otherwise non-emitting surface to be emitted therefrom. The stacked structure further comprises a number of heat extractors 1108 interleaved with the edge emitting elements 1102 and configured to extract heat therefrom for dissipation, optionally via one or more heat dissipation mechanisms and/or systems, as known in the art.

Example 12

Figure 17:
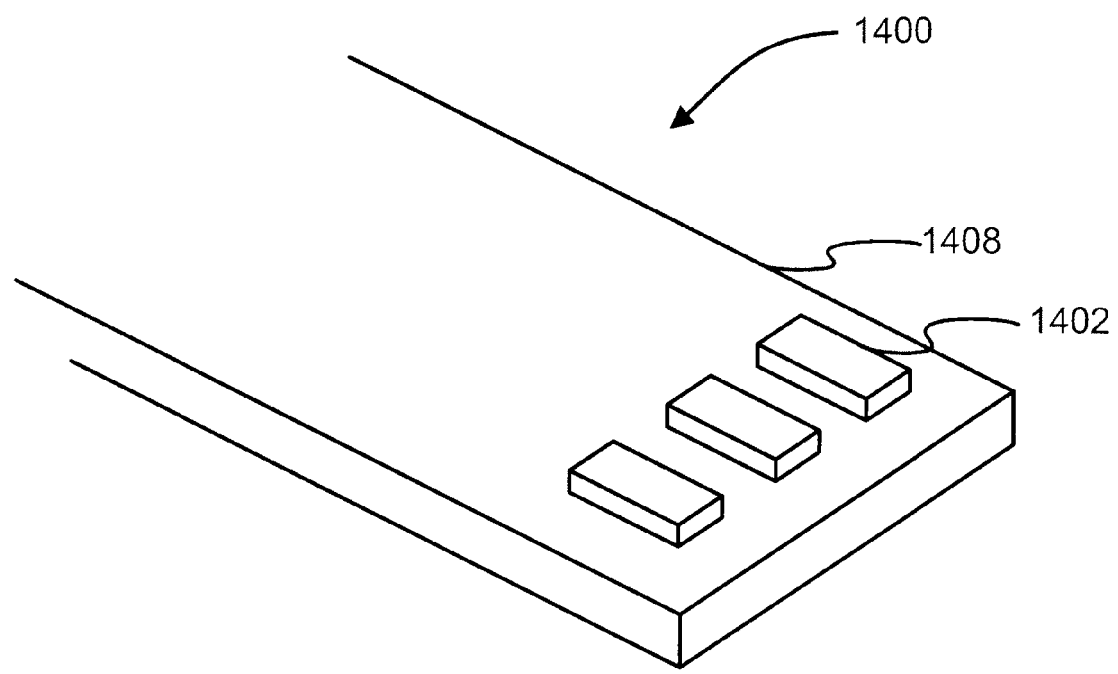
FIG. 17 is a perspective view of a heat extractor carrying light-emitting elements in accordance with one embodiment of the present invention.

With reference to FIG. 17, and in accordance with another embodiment of the present invention, there is depicted a 1D or linear array 1400 of edge emitting elements 1402, each one of which mounted, via larger, nominally non-emitting surface thereof, on a single heat extractor 1408 such that heat may be extracted therefrom via this larger surface while light may be emitted from a smaller edge of the edge emitting elements 1402. It will be appreciated that the array 1400 may be used in conjunction with various other optical and/or thermal management means, as described or referred to above, to provided a desired effect in the context of a given light source for which this array is adapted.

Example 13

Figure 18:
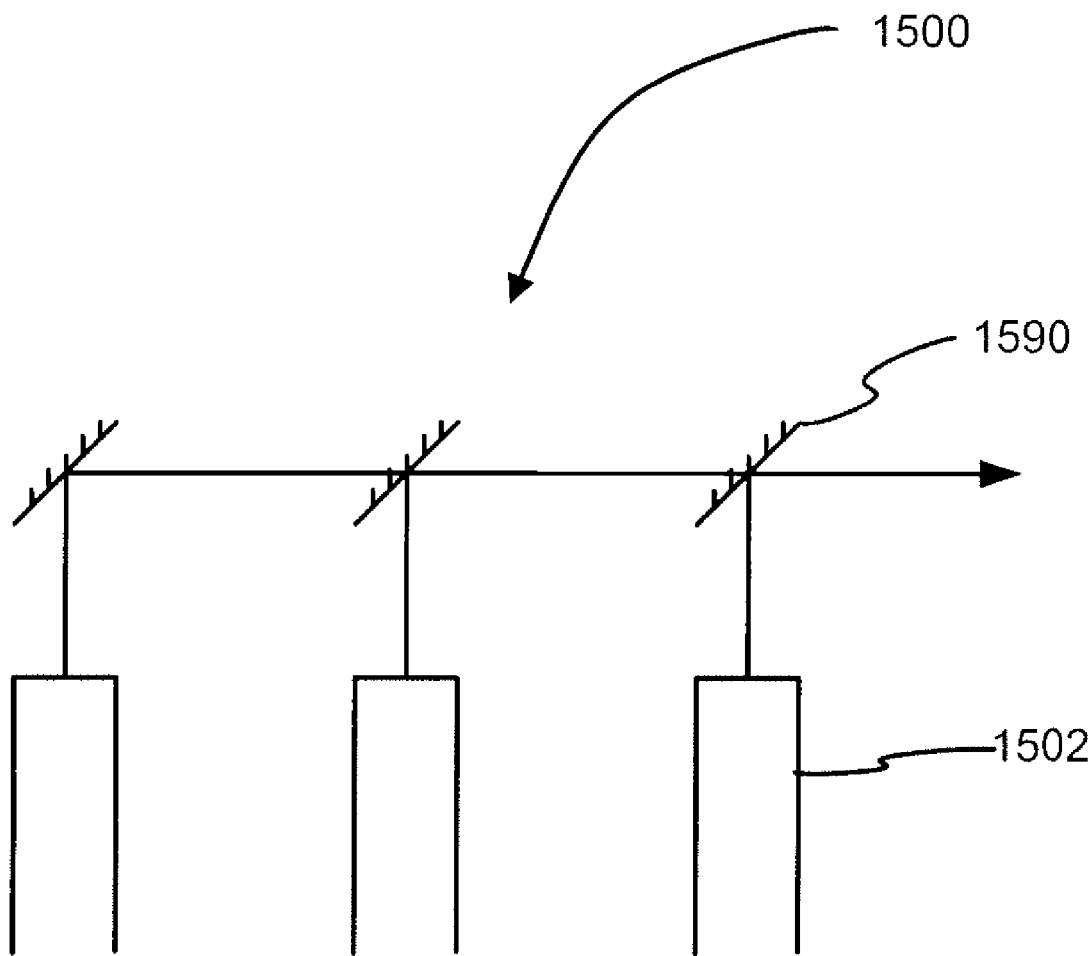
FIG. 18 is a side view of an arrangement for mixing outputs of different edge emitting elements in accordance with one embodiment of the present invention.

With reference to FIG. 18, and in accordance with another embodiment of the present invention, there is provided a light source 1500 comprising three edge emitting elements 1502, the respective outputs of which being directed to wavelength selective reflectors 1590 for combining these outputs. It will be appreciated that this principle, as depicted in FIG. 18, may be applied to other numbers of edge emitting elements and other array configuration, such as for example, 2D arrays.

The foregoing embodiments of the invention are examples and can be varied in many ways. Such present or future variations are not to be regarded as a departure from the spirit and scope of the invention, and all such modifications as would be apparent to one skilled in the art are intended to be included within the scope of the following claims.

We claim:

1. A light source for providing illumination, comprising:
   two edge emitting elements each respectively comprising one or more light-emitting edges adjoining two substantially opposed non-emitting surfaces, an area of said substantially opposed surfaces being greater than that of said one or more light-emitting edges;
   one or more heat extractors, one or more of said substantially opposed surfaces of each of said one or more edge emitting elements being thermally coupled to a respective one of said heat extractors configured to extract heat therefrom; and
   driving means for driving said one or more edge emitting elements to emit light via said two light-emitting edges thereof to provide the illumination.

2. The light source as claimed in claim 1, the light source comprising an output optics for redirecting said emitted light to provide the illumination.

3. The light source as claimed in claim 2, the light source comprising two or more of said light-emitting elements, said output optics being configured to mix respective outputs of said light-emitting elements to produce a combined optical effect.

4. The light source as claimed in claim 3, wherein said light-emitting elements are configured to produce two or more emission spectra and wherein said output optics is configured to mix said two or more emission spectra to produce said combined optical effect.

5. The light source as claimed in claim 4, wherein said light-emitting elements comprise one or more of the following: one or more red light-emitting elements, one or more amber light-emitting elements, one or more green light-emitting element and one or more blue light-emitting elements; wherein said output optics is configured to mix said emission spectra to substantially produce white light.

6. The light source as claimed in claim 2, wherein one or more of said one or more light-emitting elements comprise two light-emitting edges, said output optics being configured to redirect and combine light emitted from both said light-emitting edges to provide the illumination.

7. The light source as claimed in claim 2, wherein said one or more light-emitting edges of at least some of said one or more light-emitting elements are oriented such that an emission axis thereof is substantially perpendicular to an optical axis of the light source, said output optics being configured to redirect said emitted light along said optical axis of the light source.

8. The light source as claimed in claim 1, the light source comprising a stacked light-emitting structure, said stacked light-emitting structure comprising two or more heat extractor layers each comprising one or more of said heat extractors, and one or more light-emitting layers operatively disposed intercalated therebetween and each comprising one or more of said light-emitting elements.

9. The light source as claimed in claim 1, the light source comprising two or more light-emitting elements disposed in a substantially linear array, said substantially linear array being oriented substantially perpendicular to an optical axis of the light source.

10. The light source as claimed in claim 1, further comprising a feedback system for sensing an operational characteristic of the light source and adjusting said driving means accordingly to substantially maintain a given characteristic of the illumination.

11. A light-emitting structure for use in an illumination light source comprising driving means for driving the light-emitting structure, the light-emitting structure comprising:
   two or more light-emitting layers respectively intercalated between successive heat extractor layers, each of said light-emitting layers comprising one or more edge emitting elements, each edge emitting element comprising two light emitting edges adjoining two substantially opposed non-emitting surfaces configured to thermally couple said edge emitting elements to said successive heat extractor layers, an area of said substantially opposed surfaces being greater than that of said one or more light-emitting edges.

12. The light-emitting structure as claimed in claim 11, wherein one or more of said edge-emitting elements are configured to emit light of a colour different than that of at least another of said one or more edge-emitting elements.

13. The light-emitting structure as claimed in claim 12, wherein each of said one or more edge-emitting elements of a given one of said light-emitting layers is configured to emit light of a same colour and wherein each of said one or more edge-emitting elements of another of said light-emitting layers is configured to emit light of a same other colour.

14. The light-emitting structure as claimed in claim 13 comprising three or more light-emitting layers, each comprising one or more edge-emitting elements configured to emit light of a respective colour.

15. The light-emitting structure as claimed in claim 14 comprising one or more red light-emitting layers, one or more green light-emitting layers and one or more blue light-emitting layers.

16. The light-emitting structure as claimed in claim 14, comprising one or more red light-emitting layers, one or more amber light-emitting layers, one or more green light-emitting layers and one or more blue light-emitting layers.

17. The light-emitting structure as claimed in claim 11, the structure further comprising driving leads configured for operative coupling to the driving means, said driving leads being disposed along at least two of said heat extractor layers and operatively coupled to said light-emitting elements disposed therebetween for driving same.

18. The light-emitting structure as claimed in claim 17, wherein said driving leads are disposed along outermost ones of said heat extractor layers and configured for driving said edge-emitting elements disposed therebetween in series.

19. The light-emitting structure as claimed in claim 17, wherein said driving leads are disposed along selected ones of said heat extractor layers for selectively driving edge-emitting elements disposed therebetween independently of others, said light-emitting elements of the stacked light-emitting structure thereby being at least partially driven in parallel.

20. The light-emitting structure as claimed in claim 17, wherein said driving leads are electrically isolated from said heat extractor layers along which they are respectively disposed via a thermally conductive and electrically isolating coupling medium.

21. The light-emitting structure as claimed in claim 12, the structure configured for operative control by the light source driving means such that an intensity of light emitted by edge-emitting elements of a same colour is controlled relative to an intensity of light emitted by edge-emitting elements of another colour so to produce a combined substantially white light output.

* * * * *